United States Patent
Lhee et al.

(10) Patent No.: US 11,227,906 B2
(45) Date of Patent: *Jan. 18, 2022

(54) DISPLAY DEVICE

(71) Applicant: SAMSUNG DISPLAY CO., LTD., Yongin-si (KR)

(72) Inventors: Zail Lhee, Hwaseong-si (KR); Keunsoo Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/862,819

(22) Filed: Apr. 30, 2020

(65) Prior Publication Data

US 2020/0258963 A1 Aug. 13, 2020

Related U.S. Application Data

(63) Continuation of application No. 16/103,111, filed on Aug. 14, 2018, now Pat. No. 10,644,084.

(30) Foreign Application Priority Data

Nov. 16, 2017 (KR) .................. 10-2017-0153374

(51) Int. Cl.
*H01L 27/32* (2006.01)
*H01L 51/52* (2006.01)

(52) U.S. Cl.
CPC ...... *H01L 27/3246* (2013.01); *H01L 27/3258* (2013.01); *H01L 27/3276* (2013.01); *H01L 27/3279* (2013.01); *H01L 51/5253* (2013.01); *H01L 51/5221* (2013.01)

(58) Field of Classification Search
CPC ............ H01L 27/3246; H01L 27/3276; H01L 27/3258; H01L 51/5253
See application file for complete search history.

(56) References Cited

U.S. PATENT DOCUMENTS

| 9,818,807 | B2 | 11/2017 | Park | |
| 10,644,084 | B2 * | 5/2020 | Lhee | ................... H01L 27/3258 |
| 2006/0257785 | A1 | 11/2006 | Johnson | |

(Continued)

FOREIGN PATENT DOCUMENTS

| EP | 3276463 A1 | 1/2018 |
| KR | 1020160087982 A | 7/2016 |

(Continued)

*Primary Examiner* — Anthony Ho
(74) *Attorney, Agent, or Firm* — Cantor Colburn LLP

(57) ABSTRACT

A display device includes a base layer on which a display area and a non-display area are defined, a circuit layer including a first power electrode and driving circuits, which are disposed in the non-display area, a first planarization layer in which a first opening through which the first power electrode is exposed is defined and which covers the driving circuits, a second power electrode disposed on the first planarization layer to contact the first power electrode that is exposed through the first opening and overlapping at least a portion of the driving circuits, and a second planarization layer disposed on the first planarization layer to cover a portion of the second power electrode and having a groove part in an area overlapping the first planarization layer and the second power electrode in a plan view.

20 Claims, 18 Drawing Sheets

(56) References Cited

U.S. PATENT DOCUMENTS

| | | | |
|---|---|---|---|
| 2009/0058280 A1 | 3/2009 | Jo et al. |
| 2013/0163255 A1 | 6/2013 | Kim |
| 2016/0064691 A1 | 3/2016 | Lee et al. |
| 2017/0033312 A1 | 2/2017 | Kim et al. |
| 2018/0033830 A1 | 2/2018 | Kim et al. |

FOREIGN PATENT DOCUMENTS

| | | |
|---|---|---|
| KR | 101667800 B1 | 10/2016 |
| KR | 101763616 B1 | 8/2017 |
| KR | 1020180014398 A | 2/2018 |

* cited by examiner

DISPLAY DEVICE

This application is a continuation of U.S. patent application Ser. No. 16/103,111, filed on Aug. 14, 2018, which claims priority to Korean Patent Application No. 10-2017-0153374, filed on Nov. 16, 2017, and all the benefits accruing therefrom under 35 U.S.C. § 119, the content of which in its entirety is herein incorporated by reference.

BACKGROUND

1. Field

Exemplary embodiments of the invention herein relate to a display device that is improved in image quality and thin film encapsulation reliability.

2. Description of Related Art

A display device may be divided into a display area on which an image is display and a non-display area disposed around the display area. Recently, various studies have been made to reduce a width of the non-display area to increase the display area on which an image is displayed. However, as the non-display area is reduced, an area of elements integrated in the non-display area may be reduced in surface area, and thus, resistance increases. As the resistance increases, a voltage level may vary according to a position, thereby causing non-uniform image quality.

Also, a light emitting layer of an organic light emitting display device of display devices may include an organic material. To protect the organic material that is vulnerable to oxygen and moisture, various techniques for sealing the organic light emitting elements have been developed. In a thin film encapsulation technique of the above-mentioned various techniques, an encapsulation layer is disposed on the organic light emitting elements to block a permeation path of air and moisture. The encapsulation layer may have a structure in which an inorganic layer including an inorganic material and an organic layer including an organic material are alternately laminated.

SUMMARY

When an organic material overflows while an organic material layer is formed, an exposed organic layer may be provided to a permeation path of air and moisture.

Exemplary embodiments of the invention provide a display device that displays an image having uniform image quality and is improved in thin film encapsulation reliability.

An exemplary embodiment of the invention provides a display device including a base layer on which a display area and a non-display area are defined, a circuit layer including a first power electrode and driving circuits, which are disposed in the non-display area, a first planarization layer in which a first opening through which the first power electrode is exposed is defined and which covers the driving circuits, a second power electrode disposed on the first planarization layer to contact the first power electrode that is exposed through the first opening and overlapping at least a portion of the driving circuits, a second planarization layer disposed on the first planarization layer to cover a portion of the second power electrode and having a groove part in an area overlapping the first planarization layer and the second power electrode in a plan view, a light emitting element layer including a first electrode disposed on the second planarization layer, an emission layer disposed on the first electrode, and a second electrode disposed on the emission layer, a connection electrode contacting the second electrode and the second power electrode to electrically connect the second electrode to the second power electrode, and a thin film encapsulation layer disposed on the light emitting element layer.

In an exemplary embodiment, the display device may further include a pixel defining layer disposed on the second planarization layer and having a second opening through which the first electrode is exposed, where the first electrode and the connection electrode may include the same material.

In an exemplary embodiment, the driving circuits may include a first driving circuit and a second driving circuit, and the second driving circuit may be disposed between the first driving circuit and the display area in the plan view, and the second power electrode may overlap the first driving circuit in the plan view.

In an exemplary embodiment, the second power electrode may overlap the first driving circuit and the second driving circuit in the plan view.

In an exemplary embodiment, the connection electrode may extend from an area connected to the second electrode up to an area in which the groove part is defined and be electrically connected to the second power electrode that is exposed through the groove part.

In an exemplary embodiment, the connection electrode may extend from an area connected to the second electrode up to an area in which the first opening is defined via an area in which the groove part is defined and be electrically connected to the second power electrode.

In an exemplary embodiment, the second power electrode may include a first area overlapping the first power electrode and a second area overlapping the driving circuits in the plan view, and a plurality of third openings through which the first planarization layer is exposed may be defined in the second area.

In an exemplary embodiment, the display device may further include first insulation patterns disposed on the plurality of third openings to cover the plurality of third openings, where a plurality of fourth openings may be defined in a portion of an area of the connection electrode overlapping the plurality of third openings in the plan view.

In an exemplary embodiment, the display device may further include second insulation patterns disposed on the plurality of fourth openings to cover the plurality of fourth openings, where the first insulation patterns may include the same material as that of the second planarization layer.

In an exemplary embodiment, the connection electrode may cover a side surface of the second power electrode in which the plurality of third openings are provided, and a plurality of fourth openings may be defined in one area of the connection electrode overlapping the plurality of third openings in the plan view and covered by insulation patterns.

In an exemplary embodiment, the first planarization layer exposed by each of the plurality of third openings may have a circular or polygonal shape.

In an exemplary embodiment, the first planarization layer exposed by each of the plurality of third openings may have a linear shape extending in a predetermined direction.

In an exemplary embodiment, the non-display area may include a first non-display area and a second non-display area, which face each other with the display area therebetween in a first direction, and a third non-display area and a fourth non-display area, which face each other with the display area therebetween in a second direction crossing the first direction, where the first and second power electrodes may be disposed on at least the first, second, and third non-display areas, and the groove part may include a first groove part defined in the first non-display area and a second groove part defined in the second non-display area.

In an exemplary embodiment, the groove part may further include a third groove part defined in the third non-display area.

In an exemplary embodiment, the first groove part may include a plurality of first grooves extending in the second direction, and the plurality of first grooves are spaced apart from each other in the first direction, the second groove part may include a plurality of second grooves extending in the second direction, and the plurality of second grooves are spaced apart from each other in the first direction, and the third groove part may include a plurality of third grooves extending in the first direction, and the plurality of third grooves are spaced apart from each other in the second direction.

In an exemplary embodiment, connection grooves connecting adjacent grooves of the plurality of first grooves, the plurality of second grooves, and the plurality of third grooves to each other may be further defined in the second planarization layer.

In an exemplary embodiment, the first groove part may include a plurality of first opening patterns spaced apart from each other in the second direction, the second groove part may include a plurality of second opening patterns spaced apart from each other in the second direction, and the third groove part may include a plurality of third opening patterns spaced apart from each other in the first direction.

In an exemplary embodiment of the invention, a display device includes a base layer on which a display area and a non-display area are defined, driving circuits disposed in the non-display area, a first power electrode disposed in the non-display area outside the driving circuits, a first planarization layer in which a first opening through which the first power electrode is exposed is defined and which covers the driving circuits, a second power electrode contacting the first power electrode that is exposed through the first opening and extending above the first planarization layer overlapping the driving circuits, a second planarization layer disposed on the first planarization layer to cover a portion of the second power electrode, a light emitting element layer including a first electrode disposed on the second planarization layer, an emission layer disposed on the first electrode, and a second electrode disposed on the emission layer, a connection electrode contacting the second electrode and the second power electrode to electrically connect the second electrode to the second power electrode, and a thin film encapsulation layer disposed on the light emitting element layer.

In an exemplary embodiment, a groove part overlapping the first planarization layer and the second power electrode in a plan view may be defined in the second planarization layer, and the connection electrode may contact the second power electrode through the groove part.

In an exemplary embodiment of the invention, a display device includes a base layer on which a display area and a non-display area are defined, driving circuits and a power electrode, which are disposed in the non-display area, a first planarization layer which covers the driving circuit, a second planarization layer disposed on the first planarization layer, a light emitting element layer disposed on the second planarization layer and including a first electrode, an emission layer disposed on the first electrode, and a second electrode disposed on the emission layer, and a connection electrode which electrically connects the second electrode to the power electrode, where the power electrode may extend between the first planarization layer and the second planarization layer to overlap the driving circuit in a plan view, and a groove part through which the power electrode is exposed may be defined in the second planarization layer, and the connection electrode and the power electrode may contact each other through the groove part.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
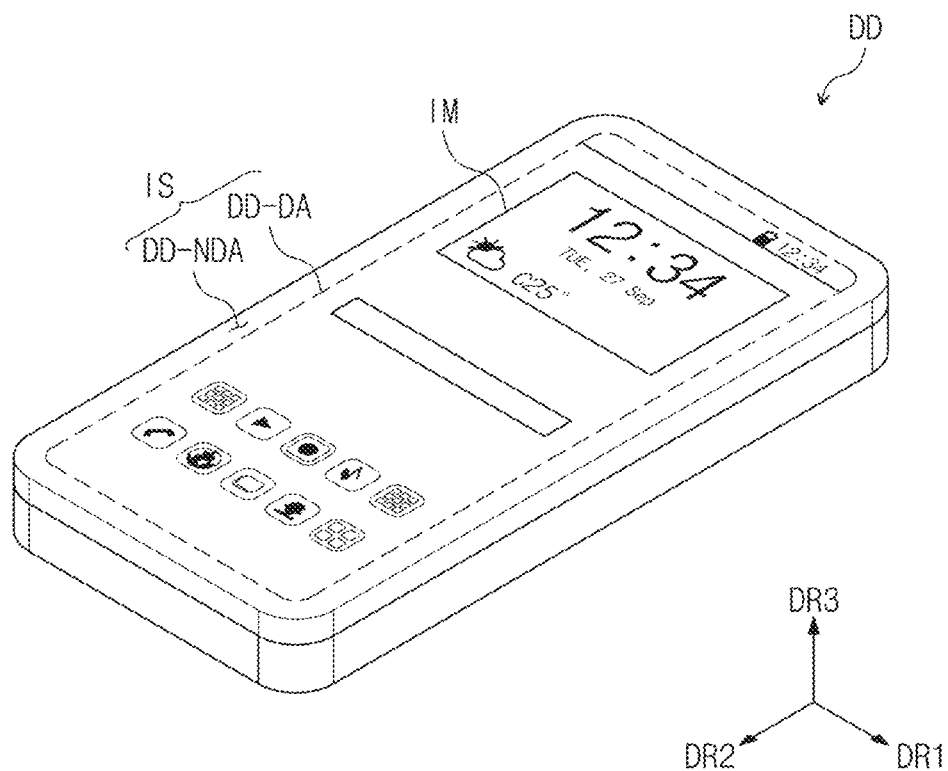
FIG. 1 is a perspective view of an exemplary embodiment of a display device according to the invention.

Hereinafter, exemplary embodiments of the invention will be described with reference to the accompanying drawings. In this specification, it will also be understood that when one component (or region, layer, portion, etc.) is referred to as being 'on', 'connected to', or 'coupled to' another component, it can be directly connected/coupled on/to the one component, or an intervening third component may also be present.

Like reference numerals refer to like elements throughout. Also, in the drawing figures, the thickness, ratio, and dimensions of components are exaggerated for clarity of illustration. The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another exemplary embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a perspective view of a display device DD according to an exemplary embodiment of the invention.

Referring to FIG. 1, a display device DD may display an image IM through a display surface IS. FIG. 1 illustrates application icons are illustrated as an example of the image IM. FIG. 1 illustrates an example of a surface defined by a first direction DR1 and a second direction DR2 crossing the first direction DR1. However, in another exemplary embodiment of the invention, a display surface (not shown) of the display device (not shown) may have a curved shape.

A normal direction of the display surface IS, i.e., a thickness direction of the display device DD is indicated as a third direction DR3. However, directions indicated as the first to third direction DR1, DR2, and DR3 may be a relative concept and thus changed into different directions. Hereinafter, the first to third directions may be directions indicated by the first to third direction DR1, DR2, and DR3 and designated by the same reference numerals, respectively.

FIG. 1 illustrates an example in which the display device DD is a portable electronic device. However, the display device DD may be applied to large electronic devices such as a television, a monitor, or an external billboard as wall as small and middle electronic devices such as a personal computer ("PC"), a notebook computer, a personal digital terminal, a car navigation unit, a game console, a smart phone, a tablet, and a camera. Also, the above-described devices are exemplified as merely an exemplary embodiment, and thus, the display device DD may be adopted for other electronic equipment unless departing from the spirit and scope of the invention.

The display surface IS includes a display area DD-DA on which an image IM is displayed and a non-display area DD-NDA that is adjacent to the display area DD-DA. The non-display area DD-NDA may be an area on which an image is not displayed. In an exemplary embodiment, the display area DD-DA may have a rectangular shape, for example. The non-display area DD-NDA may surround the display area DD-DA. However, the invention is not limited thereto. In an exemplary embodiment, the display area DD-DA and the non-display area DD-NDA may be relatively designed in shape, for example.

Figure 2:
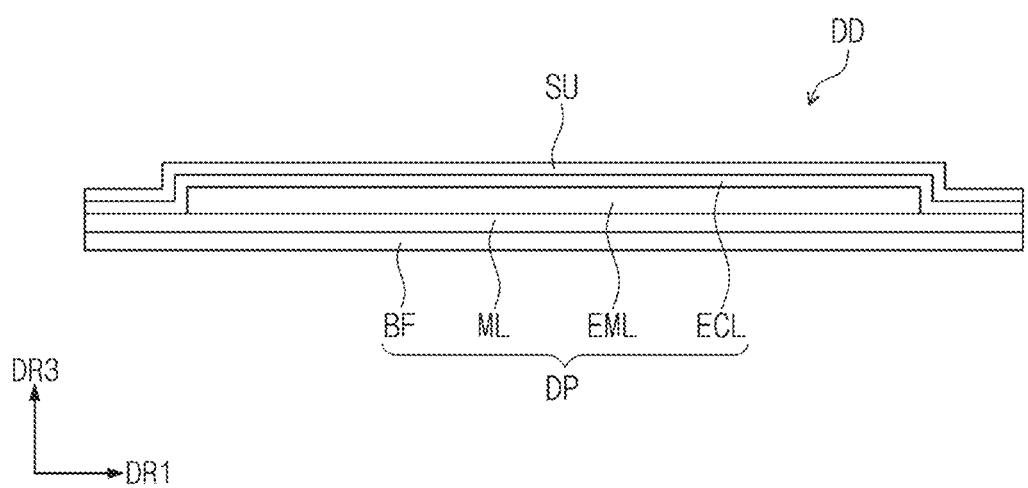
FIG. 2 is a schematic cross-sectional view of an exemplary embodiment of the display device according to the invention.
Figure 3:
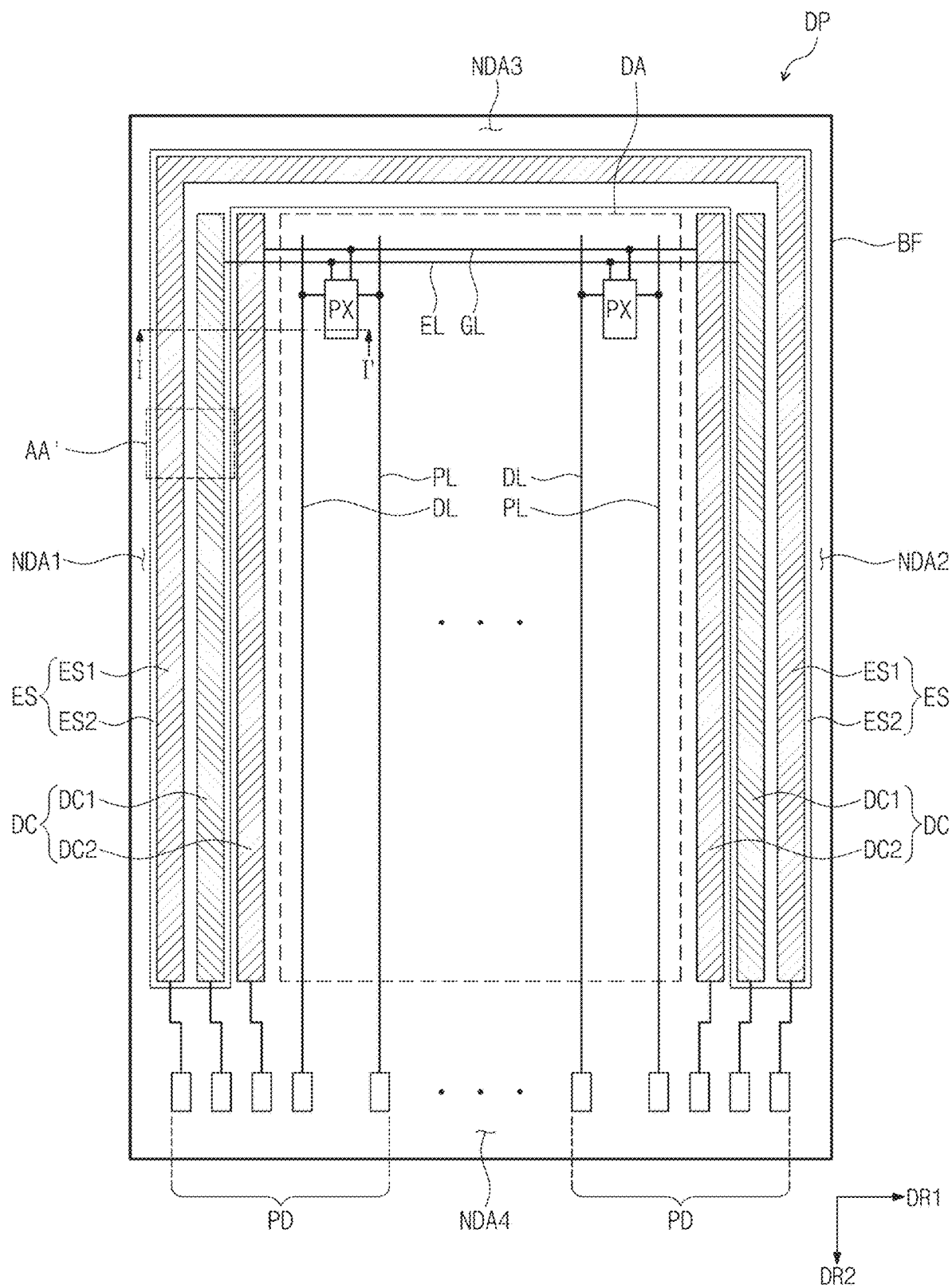
FIG. 3 is a plan view illustrating an exemplary embodiment of a portion of a display panel according to the invention.

FIG. 2 is a schematic cross-sectional view of the display device DD according to an exemplary embodiment of the invention, and FIG. 3 is a plan view illustrating a portion of a display panel DP according to an exemplary embodiment of the invention.

Referring to FIGS. 2 and 3, the display device DD may include a display panel DP and a sensing unit SU.

The display panel DP includes a base layer BF, a circuit layer ML, a light emitting element layer EML, and a thin film encapsulation layer ECL. Although an organic light emitting display panel is described as an example of the display panel DP in this specification, the invention is not limited thereto.

The base layer BF may be a silicon substrate, a plastic substrate, an insulation film, or a laminate structure including a plurality of insulation layers.

The display area DA and non-display areas NDA1, NDA2, NDA3, and NDA4 may be defined on the base layer BF. The display area DA and the non-display areas NDA1, NDA2, NDA3, and NDA4 of the base layer BF may correspond to the display area DD-DA (refer to FIG. 1) and the non-display area DD-NDA (refer to FIG. 1) of the display device DD (refer to FIG. 1), respectively. However, it is unnecessary that the display area DA and the non-display area NDA1, NDA2, NDA3, and NDA4 are respectively the same as the display area DD-DA (refer to FIG. 1) and the non-display area DD-NDA (refer to FIG. 1) of the display device DD (refer to FIG. 1). In an exemplary embodiment, the display area DA and the non-display area NDA1, NDA2, NDA3, and NDA4 may be changed according to a structure/design of the display panel DP, for example.

The circuit layer ML may be disposed on the base layer BF. The circuit layer ML may include a plurality of insulation layers, a plurality of conductive layers, and a semiconductor layer. A plurality of conductive layers of the circuit layer ML may constitute signal lines or an electrode of a transistor. In an exemplary embodiment, the circuit layer ML may include data lines DL, gate lines GL, emission control lines EL, power lines PL, driving circuits DC, power electrodes ES, and pads PD, for example.

Each of the gate lines GL, the emission control lines EL, and the data lines DL may be electrically connected to the pixels corresponding to the pixels PX. The power lines PL may be connected to the pixels PX to provide a first power voltage ELVDD (refer to FIG. 4) to the pixels PX.

The driving circuits DC may be disposed in the non-display areas NDA1, NDA2, NDA3, and NDA4. The non-display areas NDA1, NDA2, NDA3, and NDA4 may include first and second non-display areas NDA1 and NDA2 facing each other in first direction DR1 and third and fourth non-display areas NDA3 and NDA4 facing each other in the second direction DR2 with the display area DA therebetween.

Particularly, the driving circuits DC may be disposed on the first non-display area NDA1 and the second non-display area NDA2. However, this is merely an example, and the driving circuits DC may be disposed only on one of the first non-display area NDA1 and the second non-display area NDA2.

Each of the driving circuits DC may include a first driving circuit DC1 and a second driving circuit DC2. The first driving circuit DC1 may be electrically connected to the emission control lines EL, and the second driving circuit DC2 may be electrically connected to the gate lines GL. The first driving circuit DC1 and the second driving circuit DC2 may include a plurality of thin film transistors that are formed through the same process as that of the driving circuit of the pixel PX.

The first driving circuit DC1 may generate emission control signals to output the emission control signals to the emission control lines EL. The second driving circuit DC2 may generate scanning signals, and the scanning signals may be outputted to the gate lines GL. The second driving circuit DC2 may be disposed between the first driving circuit DC1 and the display area DA in a plan view. However, this is merely an example. In an exemplary embodiment, the first driving circuit DC1 and the second driving circuit DC2 may be changed in function with respect to each other, for example. In an exemplary embodiment, the first driving circuit DC1 may generate the scanning signals to output the scanning signal to the gate lines GL, and the second driving circuit DC2 may generate the emission control signals to output the emission control signals to the emission control lines EL, for example.

The power electrode ES may be disposed on the first non-display area NDA1, the second non-display area NDA2, and the third non-display area NDA3. The power electrode ES disposed on the first and second non-display areas NDA1 and NDA2 may extend in the second direction DR2, and the power electrode ES disposed on the third non-display area NDA3 may extend in the first direction DR1. The power electrode ES may have a shape surrounding a portion of the display area DA.

The power electrode ES may include a first power electrode ES1 and a second power electrode ES2. Particularly, the first power electrode ES1 may be disposed outside the driving circuits DC to surround a portion of the display area DA, and the second power electrode ES2 may be disposed on the first power electrode ES1 to surround a portion of the display area DA. A portion of the second power electrode ES2 may overlap portions of the driving circuits DC in the plan view. In this exemplary embodiment, the second power electrode ES2 may overlap the first driving circuit DC1.

When each of the non-display areas NDA1, NDA2, NDA3, and NDA4 is reduced in width (e.g., taken along the first direction DR1 in FIG. 3), the area of the display area DA relative to the total area of the display panel DP may increase. However, in this case, each of the non-display areas NDA1, NDA2, NDA3, and NDA4 in which elements are integrated may be reduced in width, and thus, each of the elements may be reduced in size. In an exemplary embodiment, the first power electrode ES1 may be reduced in width. When the first power electrode ES1 is reduced in width, the first power electrode ES1 increases in resistance. As the first power electrode ES1 increases in resistance, a difference in voltage between one point and the other point of the first power electrode ES1 may occur, for example. However, according to an exemplary embodiment of the invention, the second power electrode ES2 may be connected to the first power electrode ES1, and the second power electrode ES2 may extend to overlap portions of the driving circuits DC. Thus, as a narrow bezel is realized, even though the first power electrode ES1 is reduced in width, since the second power electrode ES2 extends to the driving circuits DC, the total resistance of the power electrode ES may be reduced. Thus, the voltage may be reduced more than the voltage difference between the one point and the other point of the power electrode ES.

The pads PD may be disposed on the fourth non-display area NDA4. The pads PD may be electrically connected to the data lines DL, the power lines PL, the driving circuits DC, and the power electrodes ES.

Although not separately shown, the display panel DP may further include a data driving circuit coupled to the pads PD in the form of a chip on film (COF). However, this is merely an example. In an exemplary embodiment, in another exemplary embodiment, the data driving circuit may also be integrated with the circuit layer ML, for example.

The light emitting element layer EML may include organic light emitting diodes ("OLEDs"). However, the invention is not limited thereto. In an exemplary embodiment, the light emitting element layer EML may include inorganic light emitting diodes or organic-inorganic hybrid light emitting diodes according to a kind of display panel DP, for example.

The thin film encapsulation layer ECL seals the light emitting element layer EML. The thin film encapsulation layer ECL may include a plurality of inorganic layers and at least one organic layer disposed between the inorganic layers. The inorganic layers protect the light emitting element layer EML against moisture/oxygen, and the organic layer protects the light emitting element layer EML against foreign substances such as dust particles.

Also, the thin film encapsulation layer ECL may further include a buffer layer. The buffer layer may be a layer that is closest to the sensing unit SU. The buffer layer may be an inorganic layer or an organic layer. In an exemplary embodiment, the inorganic layer may include at least one of silicon nitride, silicon oxynitride, silicon oxide, titanium oxide, and aluminum oxide, for example. In an exemplary embodiment, the organic layer may include an acrylic-based organic layer, for example. However, the invention is not limited thereto.

The sensing unit SU may include a circuit that detects touch. In an exemplary embodiment, a touch detection method of the sensing unit SU includes a resistive type, an optical type, a capacitive type, an ultrasonic type, and the like, for example, but is not limited thereto. Here, the capacitive type sensing unit SU may detect whether touch is generated by capacitance that varies when a touch generation unit contacts a screen of the display device DD. The capacitive type may be classified into mutual capacitive type and self capacitive type.

The sensing unit SU may be directly disposed on the display panel DP. The term "directly disposed" means that a component is formed through the continuous process except that the component adheres by a separate adhesion layer. However, the invention is not limited thereto. In an exemplary embodiment, the display panel DP and the sensing unit SU may be coupled to each other by an adhesion member (not shown), for example.

Figure 4:
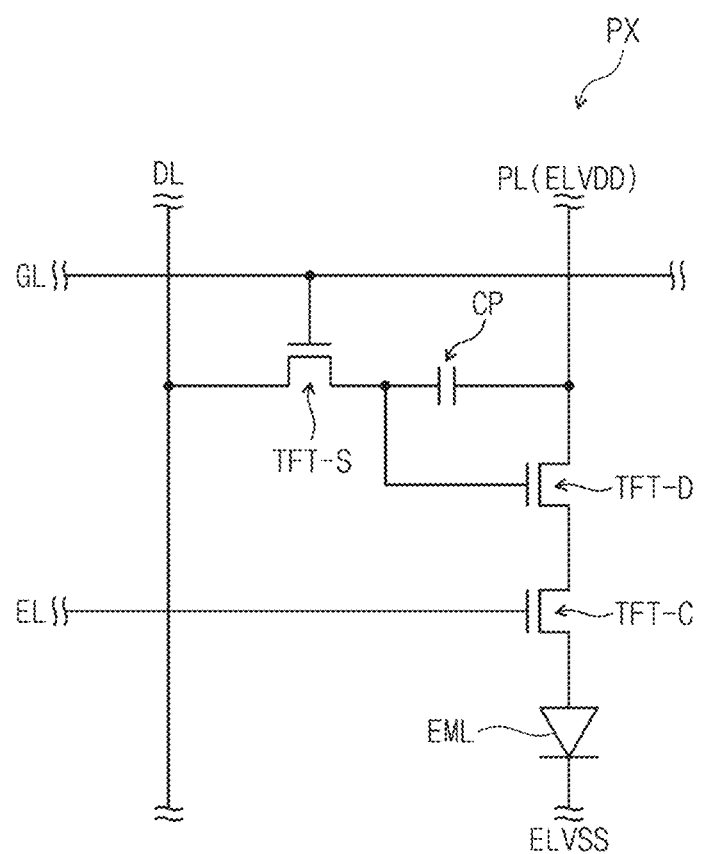
FIG. 4 is an equivalent circuit diagram of an exemplary embodiment of a pixel according to the invention.

FIG. 4 is an equivalent circuit diagram of a pixel PX according to an exemplary embodiment of the invention.

Referring to FIG. 4, an equivalent circuit of a pixel PX connected to one gate line GL, one data line DL, one emission control line EL, and the power line PL is illustrated as an example. However, this is merely an example. In other exemplary embodiments, the circuit constituting the pixel PX may be variously changed, for example.

The pixel PX may include a switching transistor TFT-S, a driving transistor TFT-D, an emission control transistor TFT-C, a capacitor CP, and a light emitting element EML.

The switching transistor TFT-S outputs a data signal applied to the data line DL in response to a scanning signal applied to the gate line GL. The capacitor CP charges a voltage corresponding to the data signal received from the switching transistor TFT-S.

The driving transistor TFT-D controls driving current flowing through the light emitting element EML to correspond to a charge amount stored in the capacitor CP. A control electrode of the driving transistor TFT-D may be connected between the switching transistor TFT-S and the capacitor CP.

The emission control transistor TFT-C may be connected between the light emitting element EML and the driving transistor TFT-D. The control electrode of the emission control transistor TFT-C may be connected to the emission control line EL. The emission control transistor TFT-C may be turned on or turned off to correspond to a signal applied to the emission control line EL. That is, the emission control transistor TFT-C may determine timing at which driving current flows to the light emitting element EML.

Although only one emission control transistor TFT-C is shown in FIG. 4, the invention is not limited thereto. In another exemplary embodiment, the light emission control transistor TFT-C may be provided in plural. In an exemplary embodiment, a further provided emission control transistor (not shown) may be provided between the driving transistor TFT-D and the power line PL, for example. A control electrode (not shown) of the emission control transistor may be connected to the emission control line EL. The emission control transistor may be turned on or turned off to correspond to the signal applied to the emission control line EL. That is, the emission control transistor TFT-C and the emission control transistor (not shown) may determine timing at which driving current flows to the light emitting element EML.

The light emitting element EML may be an OLED. The light emitting element EML may be a top emission-type diode or a bottom emission-type diode. In an alternative exemplary embodiment, the light emitting element EML may be a double side emission type diode.

A first power voltage ELVDD and a second power voltage ELVSS may be applied to the pixel PX. The first power voltage ELVDD may be applied to the pixel PX through the power line PL, and the second power voltage ELVSS may be applied to the pixel PX through the power electrode ES (refer to FIG. 3). The first power voltage ELVDD may have a voltage level greater than that of the second power voltage ELVSS.

When the level of the second power voltage ELVSS is nonuniform according to a position within the power electrode ES (refer to FIG. 3), the pixel PX within the display panel DP (refer to FIG. 3) may also have brightness that varies according to the position to deteriorate image quality. Also, power consumption for compensating the deterioration of the image quality may increase. However, according to an exemplary embodiment of the invention, the second power electrode ES2 (refer to FIG. 3) may be disposed to overlap an area on which the driving circuit DC (refer to FIG. 3) is disposed. Thus, the level of the second power voltage ELVSS may be relatively uniformly maintained within the power electrode ES (refer to FIG. 3). Thus, the image quality may be improved, and also, the increase of the power consumption may be prevented.

Figure 5:
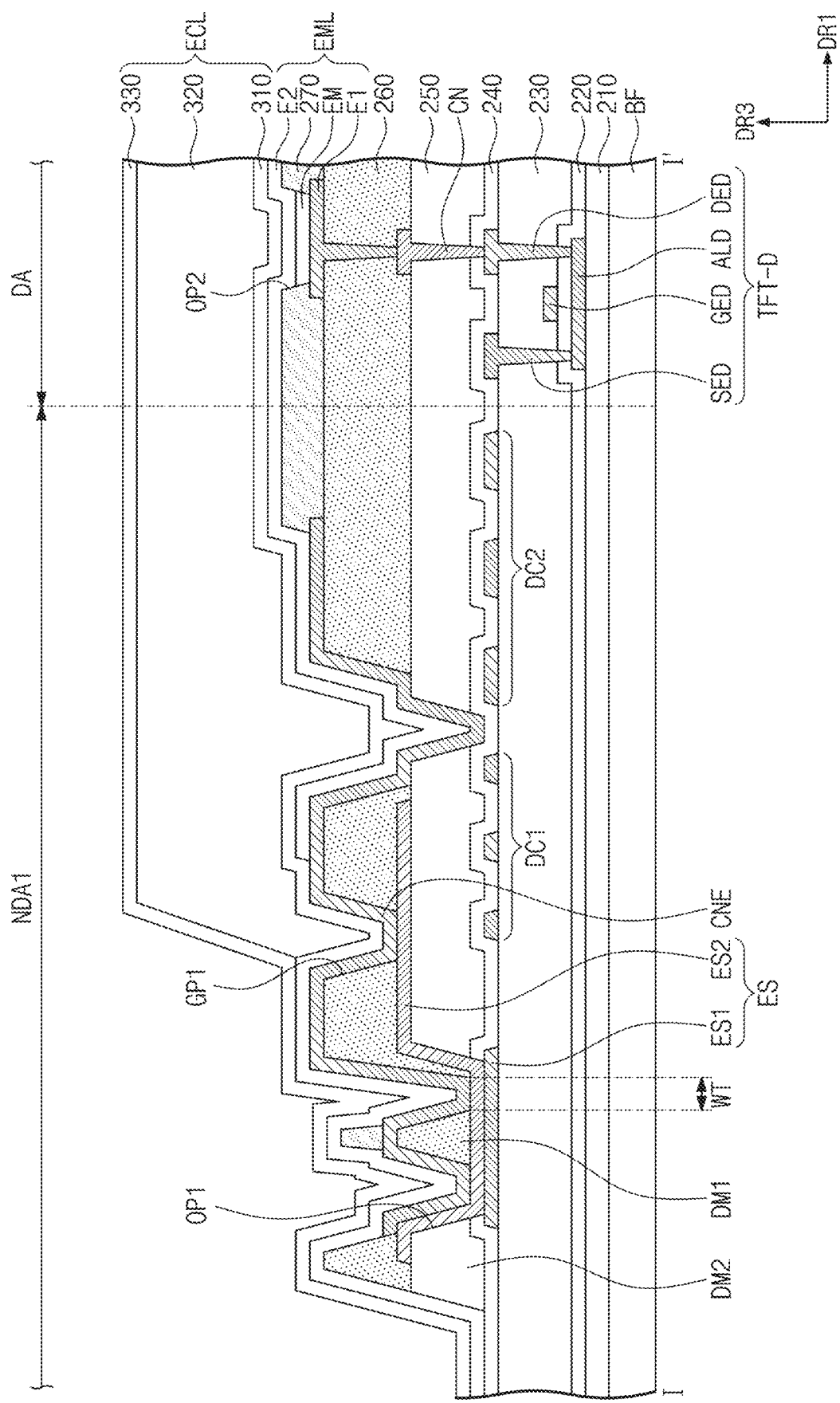
FIG. 5 is a cross-sectional view taken along line I-I' of FIG. 3.

FIG. 5 is a cross-sectional view taken along line I-I' of FIG. 3 according to an exemplary embodiment.

Referring to FIGS. 3 and 5, the first insulation layer 210 may be disposed on the base layer BF, and the driving transistor TFT-D may be disposed on the first insulation layer 210. The driving transistor TFT-D may include a semiconductor pattern ALD, a control electrode GED, a first electrode SED, and a second electrode DED.

The semiconductor pattern ALD may be disposed on the first insulation layer 210. The first insulation layer 210 may be a buffer layer providing a modified surface on the semiconductor pattern ALD. In this case, when compared with a case in which the semiconductor pattern ALD is directly disposed on the base layer BF, the semiconductor pattern ALD may have high adhesion force with respect to the first insulation layer 210. In an alternative exemplary embodiment, the first insulation layer 210 may be a barrier layer that protects a bottom of the semiconductor pattern ALD. In this case, the first insulation layer 210 may prevent contaminations or moisture from being permeated into the base layer BF itself or the semiconductor pattern ALD through the base layer BF. In an alternative exemplary embodiment, the first insulation layer 210 may be a light blocking layer that prevents external light incident through the base layer BF from being incident into the semiconductor pattern ALD. In this case, the first insulation layer 210 may further include a light blocking material.

A second insulation layer 220 may be disposed on the first insulation layer 210 to cover the semiconductor pattern ALD. The second insulation layer 220 may be an organic layer and/or an inorganic layer.

The control electrode GED may be disposed on the second insulation layer 220. A third insulation layer 230 may be disposed on the second insulation layer 220 to cover the control electrode GED. The third insulation layer 230 may be a layer that provides a planarization surface and may have a stacked structure including an organic layer or an organic layer and an inorganic layer.

The first electrode SED and the second electrode DED may be disposed on the third insulation layer 230. The first electrode SED and the second electrode DED may respectively pass through the second insulation layer 220 and the third insulation layer 230 and be connected to the semiconductor pattern ALD.

The first power electrode ES1 may be disposed on the third insulation layer 230. The first power electrode ES1 may be formed through the same process as that of the first electrode SED and the second electrode DED. Thus, the first power electrode ES1 may include the same material as that of the first electrode SED and the second electrode DED.

A fourth insulation layer 240 may be disposed on the third insulation layer 230 to cover the driving transistor TFT-D, the first driving circuit DC1, and the second driving circuit DC2. The fourth insulation layer 240 may be a passivation layer and include an inorganic layer. That is, the fourth insulation layer 240 may be formed by depositing an inorganic material.

A fifth insulation layer 250 may be disposed on the fourth insulation layer 240. The fifth insulation layer 250 may have a stacked structure including an organic layer or an organic layer and an inorganic layer. The fifth insulation layer 250 may be a planarization layer providing a planarization surface on a top surface thereof. Hereinafter, the fifth insulation layer 250 is referred to as a first planarization layer 250.

A third electrode CN and the second power electrode ES2 may be disposed on the first planarization layer 250. The third electrode CN and the second power electrode ES2 may be formed through the same process and include the same material.

Each of the third electrode CN and the second power electrode ES2 may include a material having resistance less than that of each of the first power electrode ES1, the first electrode SED, and the second electrode DED. Thus, contact resistance between the light emitting element layer EML and the driving transistor TFT-D may be reduced to improve electrical properties. Also, uniformity in level of a voltage provided to the power electrode ES by the second power electrode ES2 having resistance less than that of the first power electrode ES1 may be more improved.

The third electrode CN may pass through the first planarization layer 250 and be connected to the second electrode DED. A first opening OP1 through which the first power electrode ES1 is exposed may be defined in the first planarization layer 250, and the second power electrode ES2 may contact the first power electrode ES1 that is exposed through the first opening OP1. The openings or opening patterns described in this specification may be provided by removing a predetermined layer. Thus, in this specification, a portion of indication lines of reference symbols of the openings or the opening patterns is displayed to indicate a partition wall defining the openings or the opening pattern.

The second power electrode ES2 contacting the first power electrode ES1 may extend in a direction of the display area DA. In an exemplary embodiment, the second power electrode ES2 may extend up to an area on which the first driving circuit DC1 is disposed. Thus, the second power electrode ES2 may overlap the first driving circuit DC1 in a plan view, for example.

According to an exemplary embodiment of the invention, as the non-display area NDA1 is reduced in width, even though the first power electrode ES1 is reduced in width, the second power electrode ES2 contacting the first power electrode ES1 may be expanded to reduce the resistance of the power electrode ES. Thus, the uniformity in level of the voltage provided to the power electrode ES may be improved.

A sixth insulation layer 260 is disposed on the first planarization layer 250. The sixth insulation layer 260 may have a stacked structure including an organic layer or an organic layer and an inorganic layer. The sixth insulation layer 260 may be a planarization layer providing a planarization surface on a top surface thereof. Hereinafter, the sixth insulation layer 260 is referred to as a second planarization layer 260. The second planarization layer 260 may cover a portion of the second power electrode ES2 and the third electrode CN.

A groove part GP1 may be defined in the second planarization layer 260. The groove part GP1 may be recessed from a top surface of the second planarization layer 260. The groove part GP1 may overlap the first planarization layer 250 and the second power electrode ES2 in the plan view. The term "in the plan view" may mean when viewed in the third direction DR3. A portion of the second power electrode ES2 disposed below the second planarization layer 260 may be exposed by the groove part GP1.

The light emitting element EML may be disposed on the second planarization layer 260. The light emitting device EML may have a predetermined layer structure, and thus, be referred to as a light emitting element layer EML.

The light emitting element layer EML may include a first electrode E1, an emission layer EM, and a second electrode E2. The first electrode E1 may be disposed on the second planarization layer 260 to pass through the second planarization layer 260 and then be connected to the third electrode CN. The display panel DP according to an exemplary embodiment of the invention may further include the third electrode CN. Thus, even though the first electrode E1 passes through only the second single planarization layer 260, the first electrode E1 may be electrically connected to the driving transistor TFT-D.

A seventh insulation layer 270 may be disposed on the second planarization layer 260. A second opening OP2 may be defined in the seventh insulation layer 270. A portion of the first electrode E1 may be exposed through the second opening OP2. The emission layer EM may be disposed on the exposed first electrode E1. The emission layer EM may include an emission material, and when an electrical signal is applied, the emission layer EM may be excited to generate light. The seventh insulation layer 270 may be referred to as a pixel defining layer.

The second electrode E2 may be disposed on the emission layer EM and the seventh insulation layer 270. The second electrode E2 may contact a connection electrode CNE.

The connection electrode CNE may be disposed on the second planarization layer 260. The connection electrode CNE may be formed through the same process as that of the first electrode E1 and include the same material as that of the first electrode E1. The connection electrode CNE may contact the second electrode E2 and the power electrode ES to electrically connect the second electrode E2 to the power electrode ES. In FIG. 5, the connection electrode CNE may extend from the area contacting the second electrode E2 up to the area, in which the first opening OP1 is defined, via the area in which the groove part GP1 is defined. Thus, the connection electrode CNE may contact the power electrode ES on the area in which the groove part GP1 and the first opening OP1 are defined. Thus, the second electrode E2 may receive the second power voltage ELVSS (refer to FIG. 4) from the power electrode ES via the connection electrode CNE.

First and second dams DM1 and DM2 may be disposed in the first non-display area NDA1. The first and second dams DM1 and DM2 may be disposed in the first non-display area NDA1, the second non-display area NDA2, and the third non-display area NDA3, like the power electrode ES. However, the invention is not limited thereto. The first and second dams DM1 and DM2 may also be disposed on the fourth display area NDA4.

The first dam DM1 may be disposed on the power electrode ES, and the second dam DM2 may be disposed outside the first dam DM1. A distance between the first dam DM1 and the display area DA may be shorter than that between the second dam DM2 and the display area DA.

Although each of the first dam DM1 and the second dam DM2 has a two-layered structure in FIG. 5, the invention is not limited thereto. In another exemplary embodiment, each of the first dam DM1 and the second dam DM2 may have three or more layers or a single layer, for example.

A lower portion of the first dam DM1 may be formed through the same process as that of the second planarization layer 260. Thus, the lower portion of the first dam DM1 may have the same thickness as that of the second planarization layer 260 and include the same material as that of the second planarization layer 260. An upper portion of the first dam DM1 may be formed through the same process as that of the seventh insulation layer 270. Thus, the upper portion of the first dam DM1 may have the same thickness as that of the seventh insulation layer 270 and include the same material as that of the seventh insulation layer 270. In this exemplary embodiment, the connection electrode CNE may be disposed between the upper portion of the first dam DM1 and the lower portion of the first dam DM1.

A lower portion of the second dam DM2 may be formed through the same process as that of the first planarization layer 250. Thus, the lower portion of the second dam DM2 may have the same thickness as that of the first planarization layer 250 and include the same material as that of the first planarization layer 250. An upper portion of the second dam DM2 may be formed through the same process as that of the second planarization layer 260. Thus, the upper portion of the second dam DM2 may have the same thickness as that of the second planarization layer 260 and include the same material as that of the second planarization layer 260. Although not shown, the second dam DM2 may further include a layer disposed on the upper portion thereof. In this case, the layer may be formed through the same process as that of the seventh insulation layer 270.

The thin film encapsulation layer ECL is disposed on the second electrode E2. The thin film encapsulation layer ECL directly covers the second electrode E2. In another exemplary embodiment of the invention, a capping layer covering the second electrode E2 may be further disposed between the thin film encapsulation layer ECL and the second electrode E2. In this case, the thin film encapsulation layer ECL may directly cover the capping layer.

The thin film encapsulation layer ECL may include a first inorganic layer 310, an organic layer 320, and a second inorganic layer 330, which are successively laminated. Although the thin film encapsulation layer ECL includes two inorganic layers and one organic layer in FIG. 5, the invention is not limited thereto. In an exemplary embodiment, the thin film encapsulation layer ECL may include three inorganic layers and two organic layers. In this case, the inorganic layers and the organic layers may be alternately laminated, for example.

The first inorganic layer 310 may cover the light emitting element layer EML to extend up to the area on which the first dam DM1 and the second dam DM2 are disposed. In an exemplary embodiment, to control a flow of the organic material applied to the first inorganic layer 310, hydrophobic or hydrophilic plasma treatment may be performed on the first inorganic layer 310, for example.

The organic layer 320 may be disposed on the first inorganic layer 310. The organic layer 320 may be formed by depositing, printing, or coating an organic material. According to this exemplary embodiment, overflowing of the liquid organic materials may be prevented by the groove part GP1, the first dam DM1, and the second dam DM2. As the first non-display area NDA1 is reduced in width, a distance WT between the first dam DM1 and the second planarization layer 260 may be reduced. In this case, the overflowing of the organic material occurs, the overflowing organic material may not be sufficiently received due to the reduction in width of the distance WT, and thus, the organic layer may be exposed to the outside. The organic layer exposed to the outside may serve as a permeation path of air and moisture. However, according to an exemplary embodiment of the invention, the overflowing organic material may be primarily controlled by the first groove part GP1. Therefore, the thin film encapsulation may be more improved in reliability.

Figure 6:
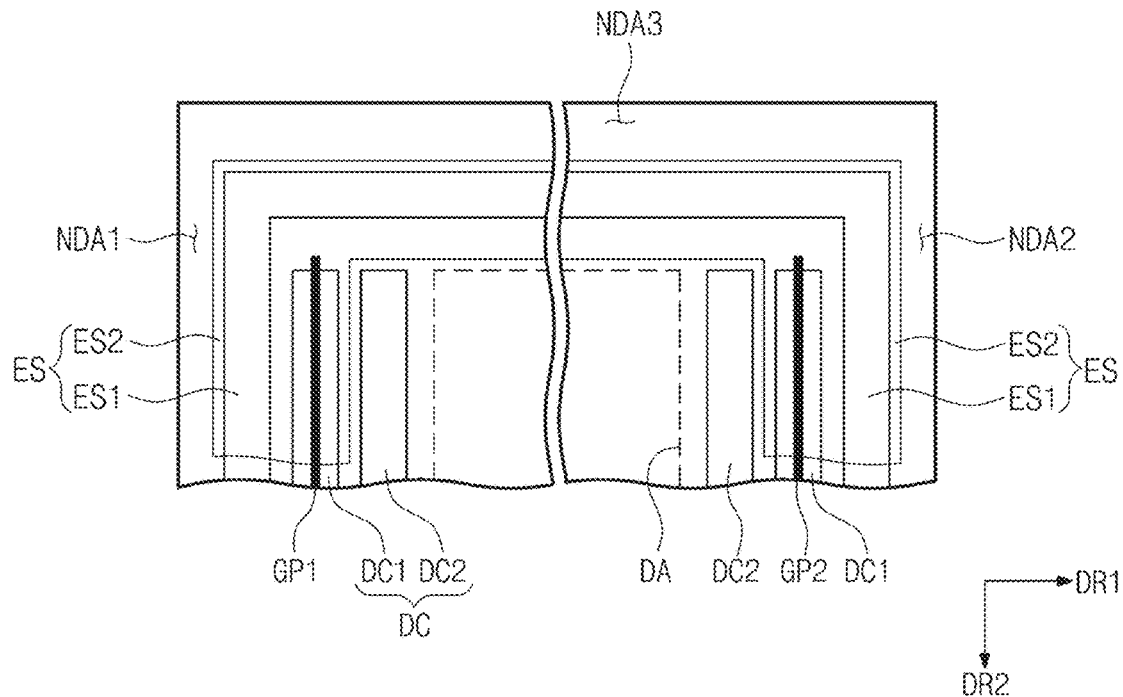
FIG. 6 is a plan view illustrating an exemplary embodiment of a portion of the display device according to the invention.

FIG. 6 is a plan view illustrating a portion of the display device according to an exemplary embodiment of the invention.

Referring to FIG. 6, groove parts GP1 and GP2 defined in the second planarization layer 260 (refer to FIG. 5), the power electrode ES, and the driving circuits DC are illustrated.

The groove parts GP1 and GP2 may be divided into a first groove part GP1 defined in the first non-display area NDA1 and a second groove part GP2 defined in the second non-display area NDA2. The first groove part GP1 and the second groove part GP2 may be spaced apart from each other with the display area DA therebetween in the first direction DR1. Each of the first groove part GP1 and the second groove part GP2 may extend in the second direction DR2.

Figure 7:
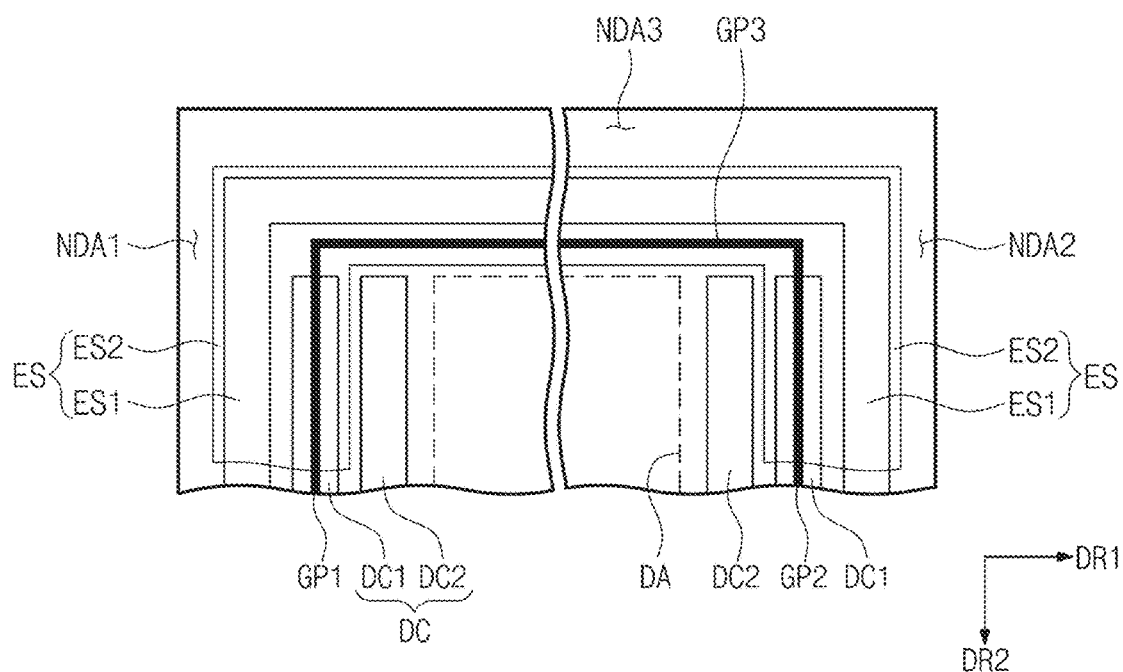
FIG. 7 is a plan view illustrating an exemplary embodiment of a portion of the display device according to the invention.

FIG. 7 is a plan view illustrating a portion of the display device according to an exemplary embodiment of the invention.

Referring to FIG. 7, groove parts GP1, GP2, and GP3 defined in the second planarization layer 260 (refer to FIG. 5), the power electrode ES, and the driving circuits DC are illustrated.

The groove parts GP1, GP2, and GP3 may be divided into a first groove part GP1 defined in the first non-display area NDA1, a second groove part GP2 defined in the second non-display area NDA2, and a third groove part GP3 defined in the third non-display area NDA3. The third groove part GP3 may extend in the first direction DR1. The third groove part GP3 may connect the first groove part GP1 and the second groove part GP2, which are spaced apart from each other with the display area DA in the first direction DR1, to each other.

Figure 8:
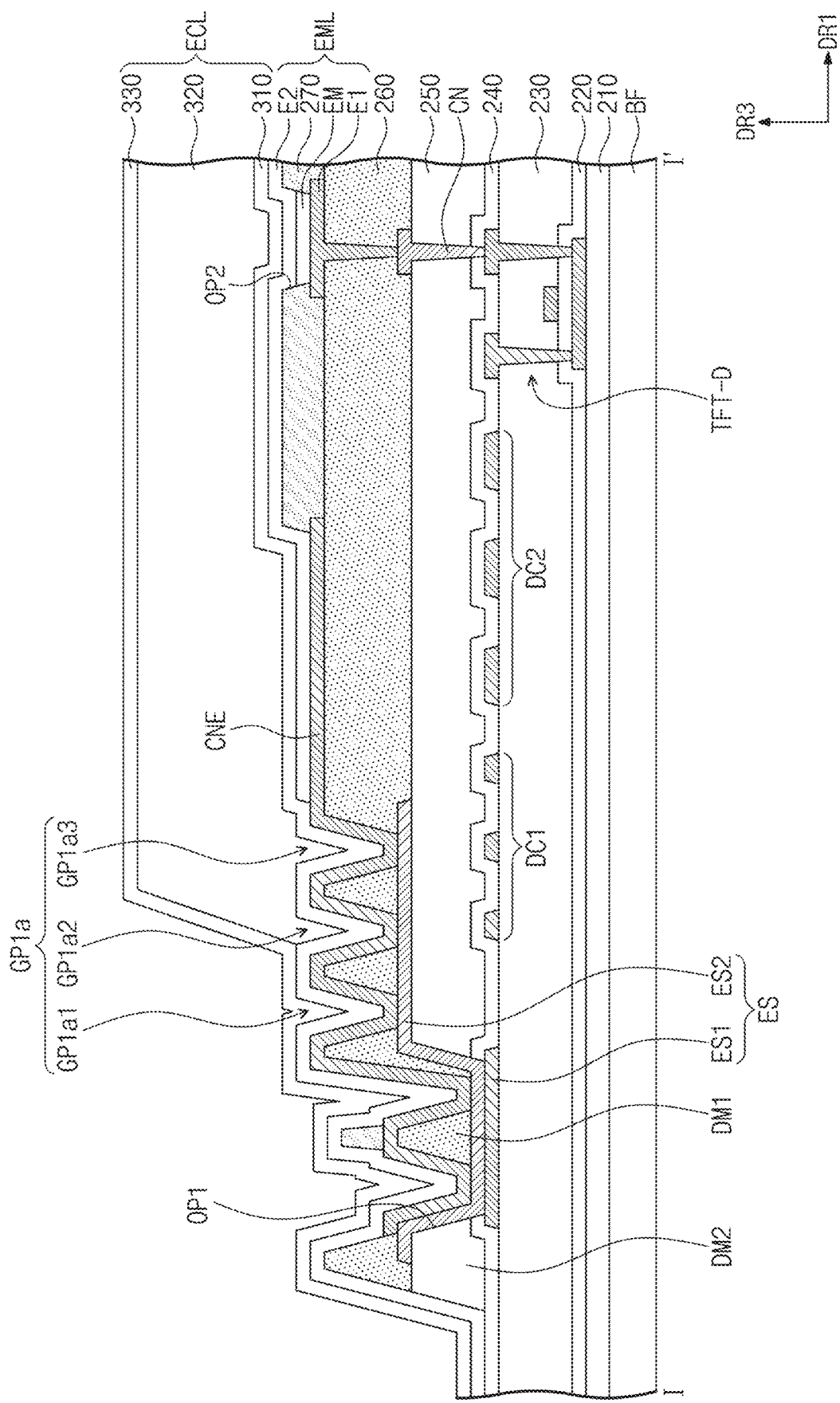
FIG. 8 is a cross-sectional view illustrating an exemplary embodiment taken along line I-I' of FIG. 3.

FIG. 8 is a cross-sectional view taken along line I-I' of FIG. 3 according to an exemplary embodiment. In description of FIG. 8, the same reference numeral may be given to components that are the same as the components of FIG. 5, and their detailed descriptions will be omitted.

Referring to FIG. 8, a groove part GP1a may include a plurality of grooves GP1a1, GP1a2, and GP1a3. Although three grooves GP1a1, GP1a2, and GP1a3 are illustrated as an example in FIG. 8, the invention is not limited thereto. In an exemplary embodiment, the groove part GP1a may include two grooves or four or more grooves, for example. Since the groove parts GP1a includes the plurality of grooves GP1a1, GP1a2, and GP1a3, a space for accommodating the overflowing organic materials may more increase.

Figure 9:
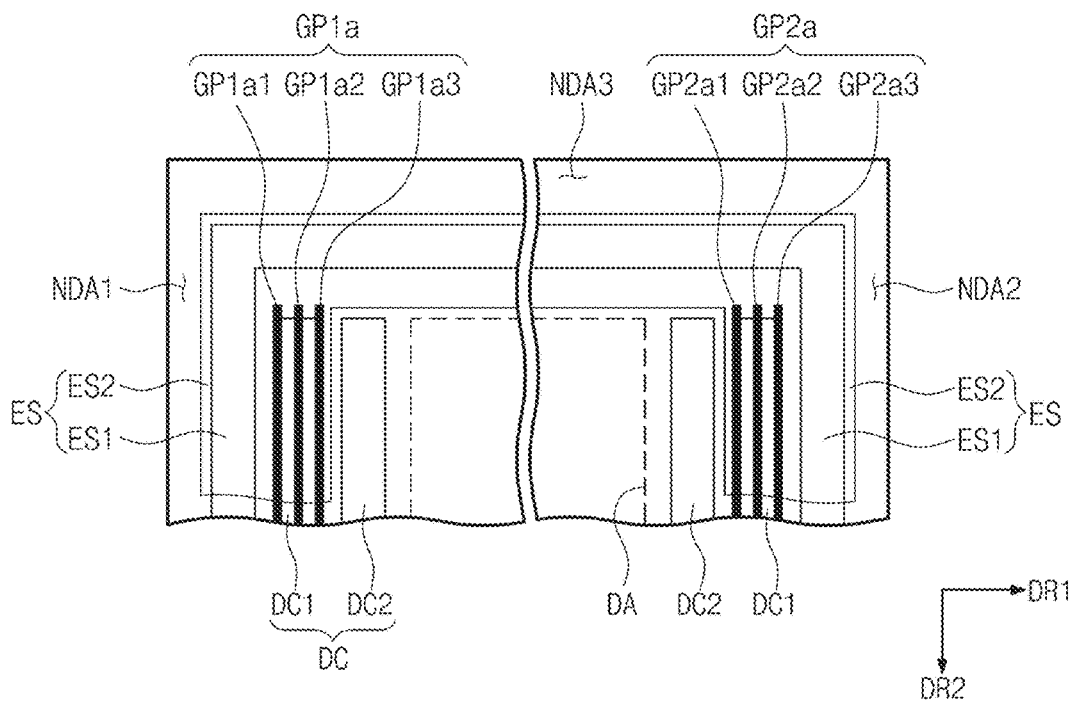
FIG. 9 is a plan view illustrating an exemplary embodiment of a portion of the display device according to the invention.

FIG. 9 is a plan view illustrating a portion of the display device according to an exemplary embodiment of the invention.

Referring to FIGS. 8 and 9, groove parts GP1a and GP2a defined in the second planarization layer 260, the power electrode ES, and the driving circuits DC are illustrated. The groove parts GP1a and GP2a may be divided into a first groove part GP1a defined in the first non-display area NDA1 and a second groove part GP2a defined in the second non-display area NDA2. The first groove part GP1a and the second groove part GP2a may be spaced apart from each other with the display area DA therebetween in the first direction DR1.

The first groove part GP1a may include a plurality of first grooves GP1a1, GP1a2, and GP1a3 extending in the second direction DR2, and the second groove part GP2a may include a plurality of second grooves GP2a1, GP2a2, and GP2a3 extending in the second direction DR2. The plurality of first grooves GP1a1, GP1a2, and GP1a3 and the plurality of second grooves GP2a1, GP2a2, and GP2a3 may be spaced apart from each other in the first direction DR1.

Figure 10:
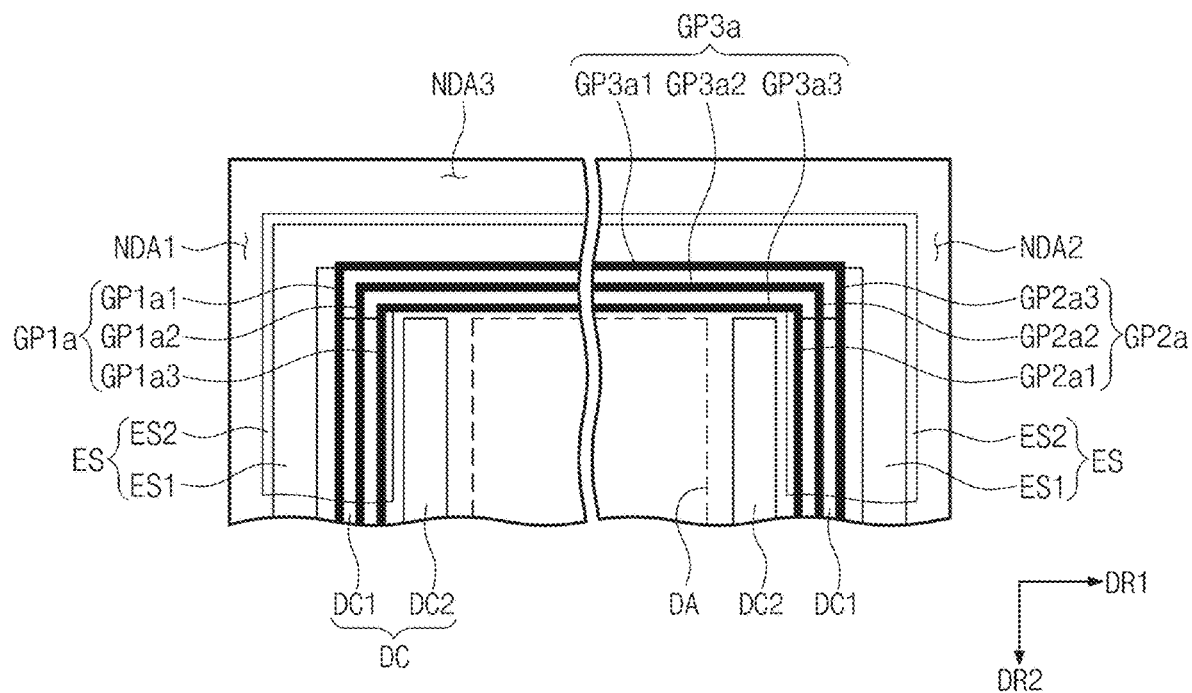
FIG. 10 is a plan view illustrating an exemplary embodiment of a portion of the display device according to the invention.

FIG. 10 is a plan view illustrating a portion of the display device according to an exemplary embodiment of the invention. In description of FIG. 10, the same reference numeral may be given to components that are the same as the components of FIG. 9, and their detailed descriptions will be omitted.

Referring to FIGS. 8 and 10, groove parts GP1a, GP2a, and GP3a defined in the second planarization layer 260, the power electrode ES, and the driving circuits DC are illustrated. The groove parts GP1a, GP2a, and GP3a may further include a third groove part GP3a defined in the third non-display area NDA3 when compared with that of FIG. 9. The third groove part GP3a may connect the first groove GP1a to the second groove GP2a.

The third groove part GP3a may include a plurality of third grooves GP3a1, GP3a2, and GP3a3 extending in the first direction DR1. The plurality of third grooves GP3a1, GP3a2, and GP3a3 may be arranged to be spaced apart from each other in the second direction DR2.

The third groove GP3a1 disposed at the outermost portion the display panel DP may be connected to ends of the first groove GP1a1 disposed at the outermost portion and the second groove GP2a3 disposed at the outermost portion. Also, the first groove GP1a3 and the second grooves GP2a1 defined closest to the display area DA may be connected to each other by the third groove GP3a3 defined closest to the display area DA. The third groove GP3a2 that is an intermediate portion may connect the first groove GP1a2 and the second groove GP2a2, which are defined in the intermediate portion, to each other. When the organic material overflows to the third display area NDA3, the third grooves GP3a1, GP3a2, and GP3a3 may further provide spaces for accommodating the organic material.

Figure 11:
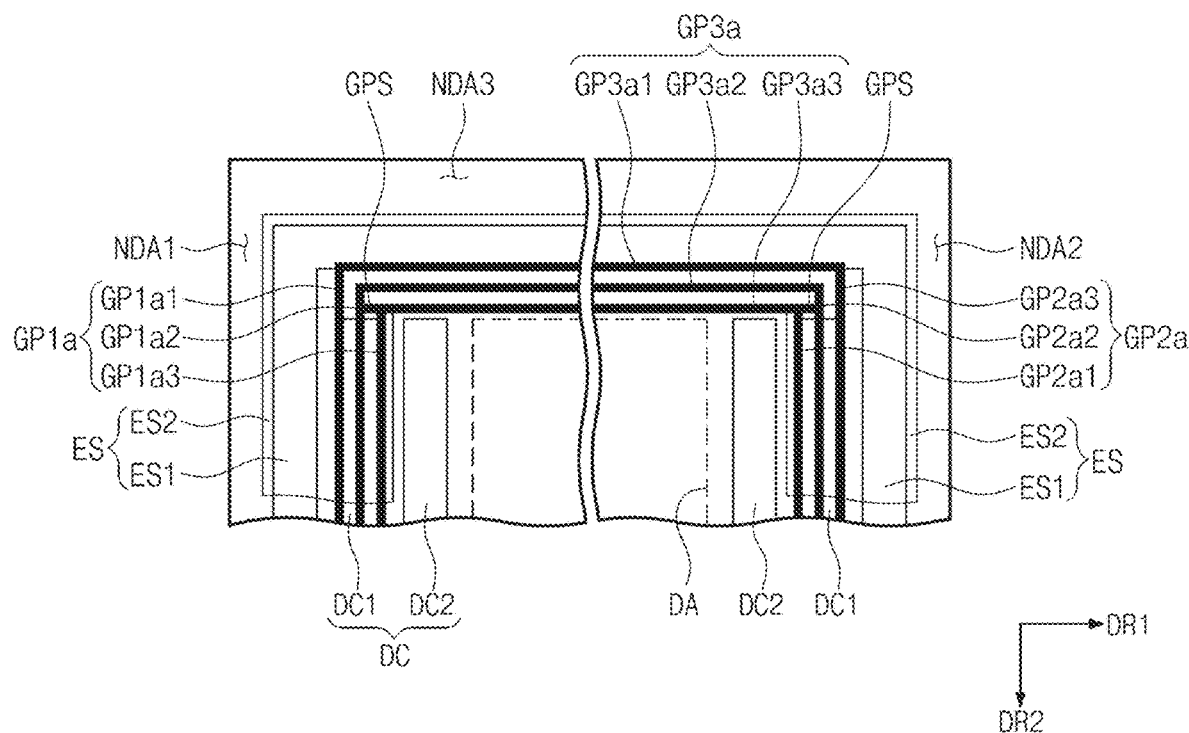
FIG. 11 is a plan view illustrating an exemplary embodiment of a portion of the display device according to the invention.

FIG. 11 is a plan view illustrating a portion of the display device according to an exemplary embodiment of the invention. In description of FIG. 11, the same reference numeral may be given to components that are the same as the components of FIG. 10, and their detailed descriptions will be omitted.

Referring to FIGS. 8 and 11, connection grooves GPS may be further defined in FIG. 11. The connection grooves GPS may be provided together with the groove parts GP1a, GP2a, and GP3a on the second planarization layer 260.

The connection grooves GPS may connect the adjacent grooves to each other. In FIG. 11, the connection grooves GPS connect portions of the first grooves GP1a2 and GP1a3 to each other and connect portions of the second grooves GP2a1 and GP2a2 to each other. The grooves spaced apart from each other may be connected to each other by the connection grooves GPS. Thus, when the organic material is accommodated into the groove closest to the display area DA, the organic material may move to the other grooves through the connection grooves GPS before the organic material overflows from the closest groove. Thus, the overflowing of the organic material may be more mitigated.

Although only two connection grooves GPS are illustrated in FIG. 11, the invention is not limited thereto. In another exemplary embodiment, three or more connection grooves GPS may be provided, for example. In this case, a portion of the connection grooves GPS may connect the first grooves GP1a1 and GP1a2 to each other, connect the second grooves GP2a2 and GP2a3 to each other, or connect the third grooves GP3a2 and GP3a1 to each other.

Figure 12:
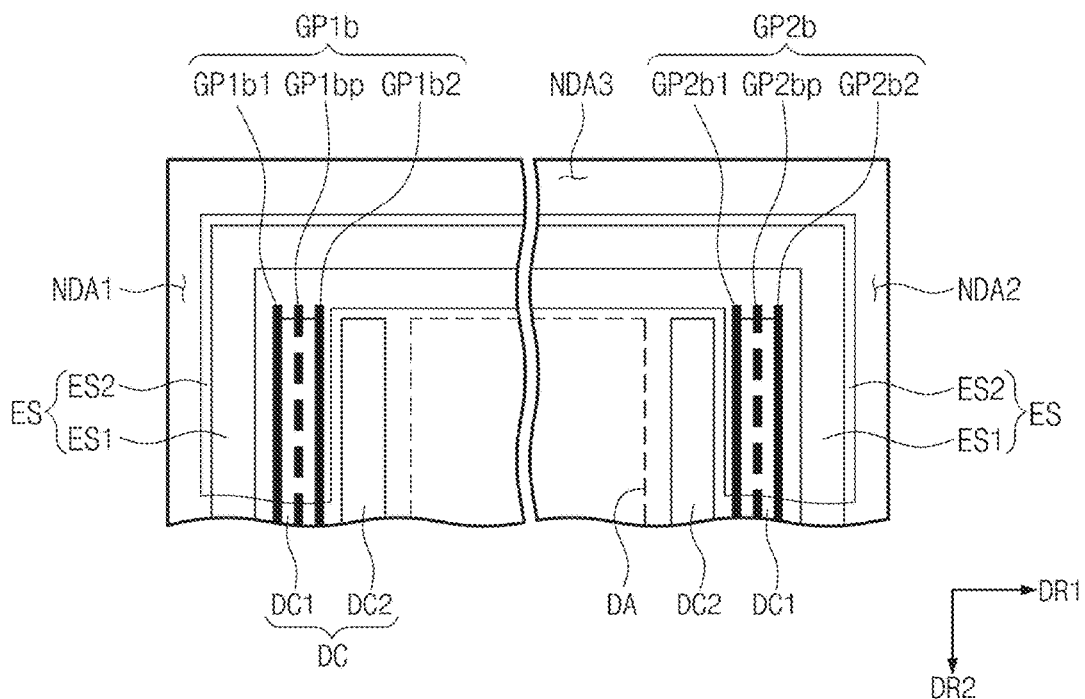
FIG. 12 is a plan view illustrating an exemplary embodiment of a portion of the display device according to the invention.

FIG. 12 is a plan view illustrating a portion of the display device according to an exemplary embodiment of the invention.

Referring to FIGS. 8 and 12, groove parts GP1b and GP2b defined in the second planarization layer 260, the power electrode ES, and the driving circuits DC are illustrated. The groove parts GP1b and GP2b may be divided into a first groove part GP1b defined in the first non-display area NDA1 and a second groove part GP2b defined in the second non-display area NDA2. The first groove part GP1b and the second groove part GP2b may be spaced apart from each other with the display area DA therebetween in the first direction DR1.

The first groove part GP1b may include first grooves GP1b1 and GP1b2 extending in the second direction DR2 and first groove patterns GP1bp disposed between the first grooves GP1b1 and GP1b2 and arranged in the second direction DR2. The second groove part GP2b may include second grooves GP2b1 and GP2b2 extending in the second direction DR2 and second groove patterns GP2bp disposed between the second grooves GP2b1 and GP2b2 and arranged in the second direction DR2.

Figure 13:
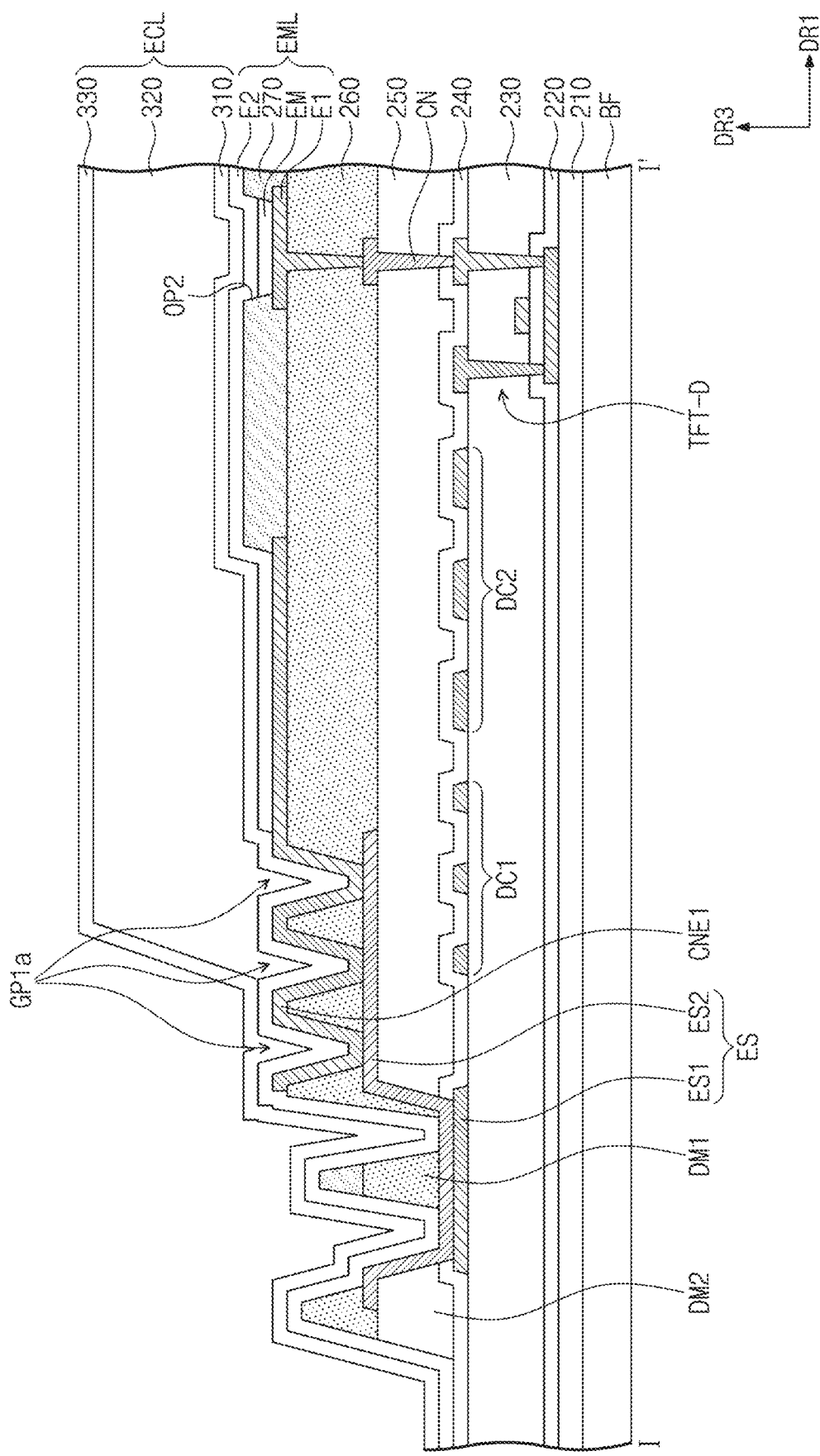
FIG. 13 is a cross-sectional view illustrating an exemplary embodiment taken along line I-I' of FIG. 3.

FIG. 13 is a cross-sectional view taken along line I-I' of FIG. 3 according to an exemplary embodiment. In description of FIG. 13, the same reference numeral may be given to components that are the same as the components of FIG. 5, and their detailed descriptions will be omitted.

Referring to FIG. 13, a connection electrode CNE1 may be formed through the same process as that of the first electrode E1 and include the same material as that of the first electrode E1. The connection electrode CNE1 may contact the second electrode E2 and the power electrode ES to electrically connect the second electrode E2 to the power electrode ES. In FIG. 13, the connection electrode CNE1 may extend from the area contacting the second electrode E2 up to the area, in which the groove part GP1a is defined, to contact the second power electrode ES2 exposed by the groove part GP1a.

Figure 14:
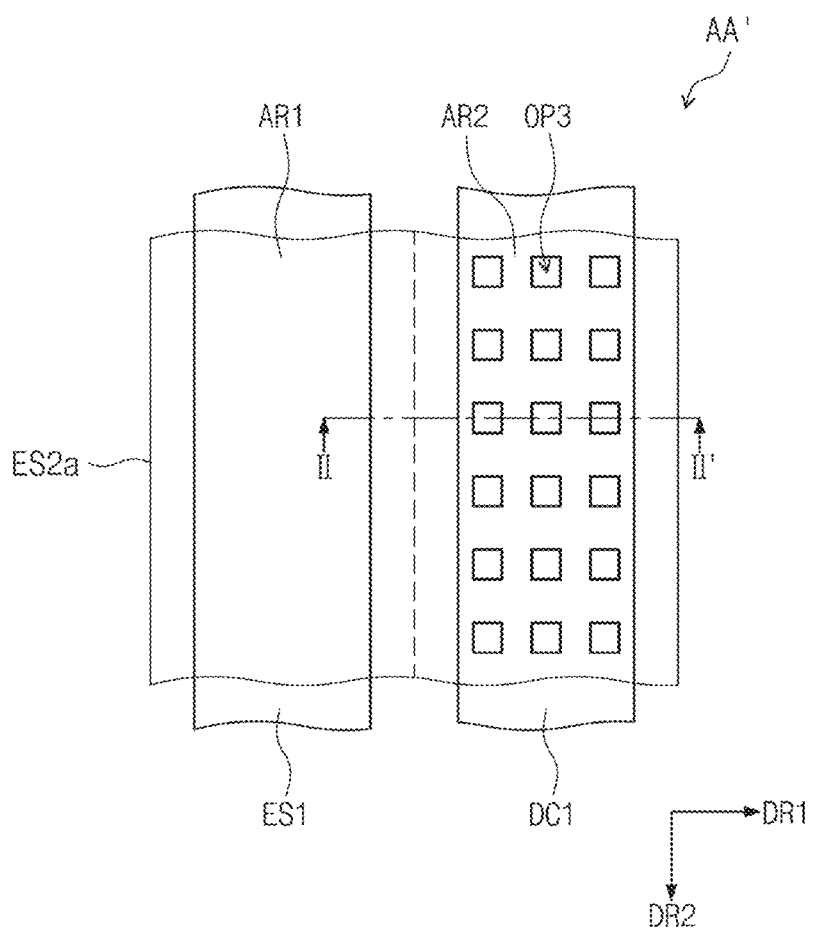
FIG. 14 is a plan view illustrating an example of an enlarged area AA' of FIG. 3.
Figure 15:
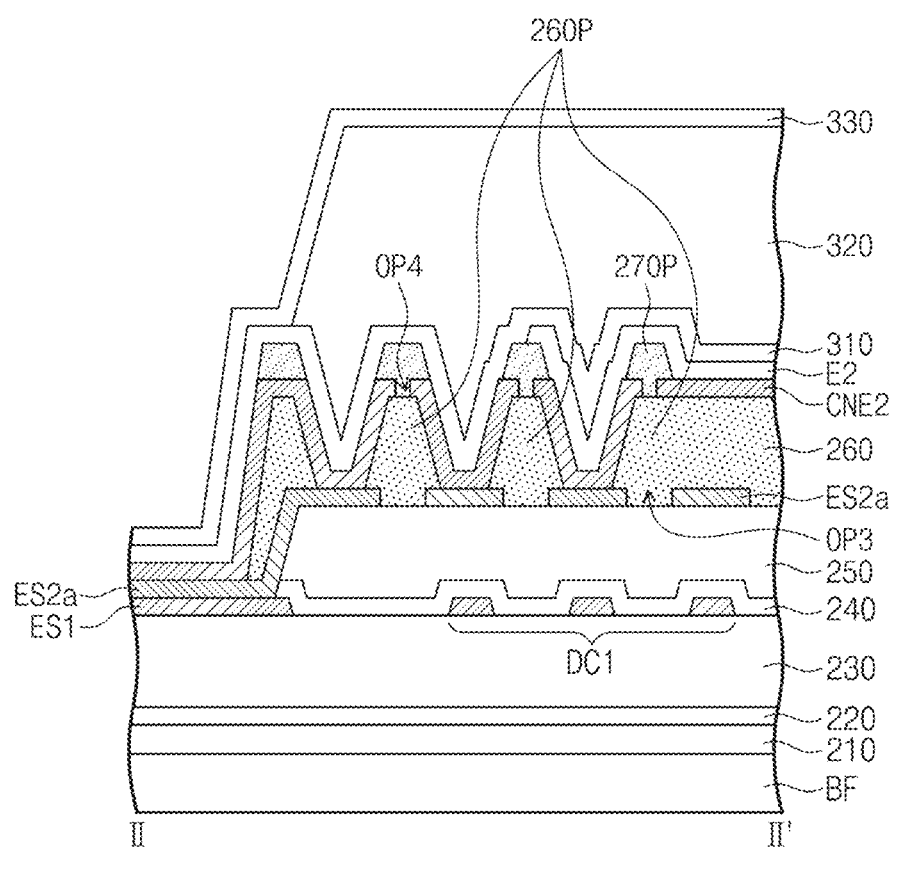
FIG. 15 is a cross-sectional view illustrating an exemplary embodiment taken along line II-IF of FIG. 14.

FIG. 14 is a plan view illustrating an example of an enlarged area AA' of FIG. 3, and FIG. 15 is a cross-sectional view taken along line II-IF of FIG. 14 according to an exemplary embodiment.

Referring to FIGS. 14 and 15, a second power electrode ES2a includes a first area AR1 overlapping the first power electrode ES1 and a second area AR2 overlapping the first driving circuit DC1.

A plurality of third openings OP3 through the first planarization layer 250 is exposed are defined in the second area AR2 of the second power electrode ES2a. The third openings OP3 may discharge a gas generated in the first planarization layer 250. The third openings OP3 may be defined in the form of a matrix in the first and second directions DR1 and DR2. However, the invention is not limited thereto. In an exemplary embodiment, the third openings OP3 may be arranged in parallel to the first direction DR1 and be arranged in a zigzag shape in the second direction DR2, for example. Also, although not shown, the third openings OP3 may be defined in the second non-display area NDA2 (refer to FIG. 3) and the third non-display area NDA3 (refer to FIG. 3) of FIG. 3.

First insulation patterns 260P covering the third openings OP3 may be disposed on the third openings OP3. The first insulation patterns 260P may be formed through the same process as that of the second planarization layer 260 and include the same material as that of the second planarization layer 260.

A connection electrode CNE2 is disposed on the first insulation patterns 260 P. The connection electrode CNE2 may connect the second electrode E2 to the second power electrode ES2a. Fourth openings OP4 may be defined in a portion of the area of the connection electrode CNE2 overlapping the third opening OP3 in the plan view. The fourth openings OP4 may discharge a gas generated in the first and second planarization layers 250 and 260.

Second insulation patterns 270P covering the fourth openings OP4 may be disposed on the fourth openings OP4. The second insulation patterns 270P may be formed through the same process as that of the seventh insulation layer 270 (refer to FIG. 3) and include the same material as that of the seventh insulation layer 270.

Figure 16:
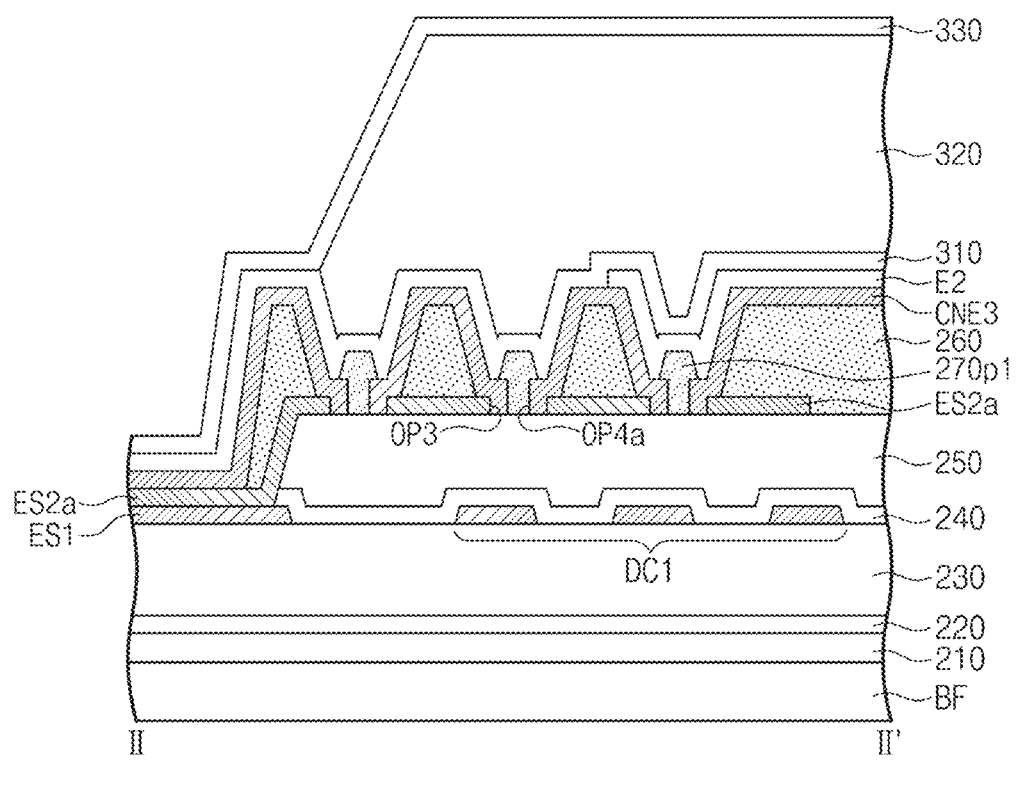
FIG. 16 is a cross-sectional view illustrating an exemplary embodiment taken along line II-IF of FIG. 14.

FIG. 16 is a cross-sectional view taken along line II-IF of FIG. 14 according to an exemplary embodiment.

Referring to FIGS. 14 and 16, third openings OP3 through the first planarization layer 250 is exposed are defined in the second area AR2 of the second power electrode ES2a. The third openings OP3 may discharge a gas generated in the first planarization layer 250.

A connection electrode CNE3 may cover a side surface of the second power electrode ES2a in which the third openings OP3 are defined, and fourth openings OP4a may be defined in one area overlapping the third openings OP3 in the plan view.

Second insulation patterns 270p1 covering the fourth openings OP4a may be disposed on the fourth openings OP4a. The second insulation patterns 270p1 may be formed through the same process as that of the seventh insulation layer 270 (refer to FIG. 3) and include the same material as that of the seventh insulation layer 270.

Figure 17:
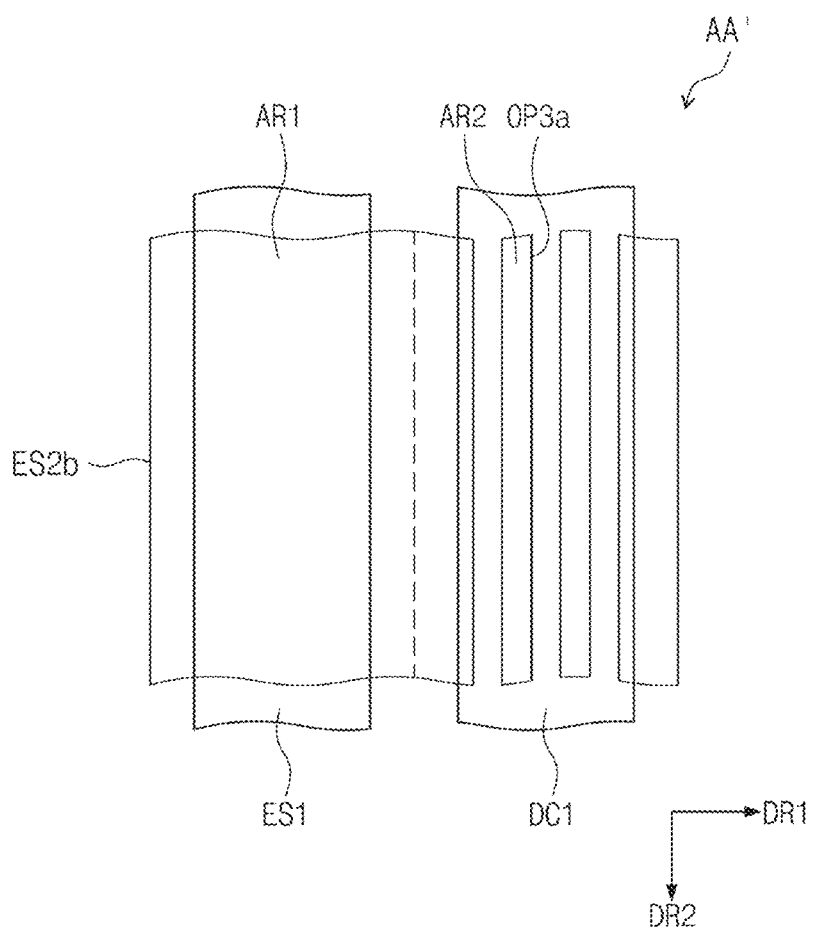
FIG. 17 is a plan view illustrating an example of the enlarged area AA' of FIG. 3.

FIG. 17 is a plan view illustrating an example of the enlarged area AA' of FIG. 3.

Referring to FIG. 17, a second power electrode ES2b includes a first area AR1 overlapping the first power electrode ES1 and a second area AR2 overlapping the first driving circuit DC1.

A plurality of third openings OP3a through the first planarization layer 250 (refer to FIG. 16) is exposed is defined in the second area AR2 of the second power electrode ES2b. The third openings OP3a may discharge a gas generated in the first planarization layer 250. The third openings OP3a may extend in the second direction DR2 and be disposed to be spaced apart from each other in the first direction DR1. Also, although not shown, the third openings OP3a may be defined in the second non-display area NDA2 and the third non-display area NDA3 of FIG. 3. The third openings OP3a defined in the third non-display area NDA3 may extend in the first direction DR1 and be disposed to be spaced apart from each other in the second direction DR2.

Figure 18:
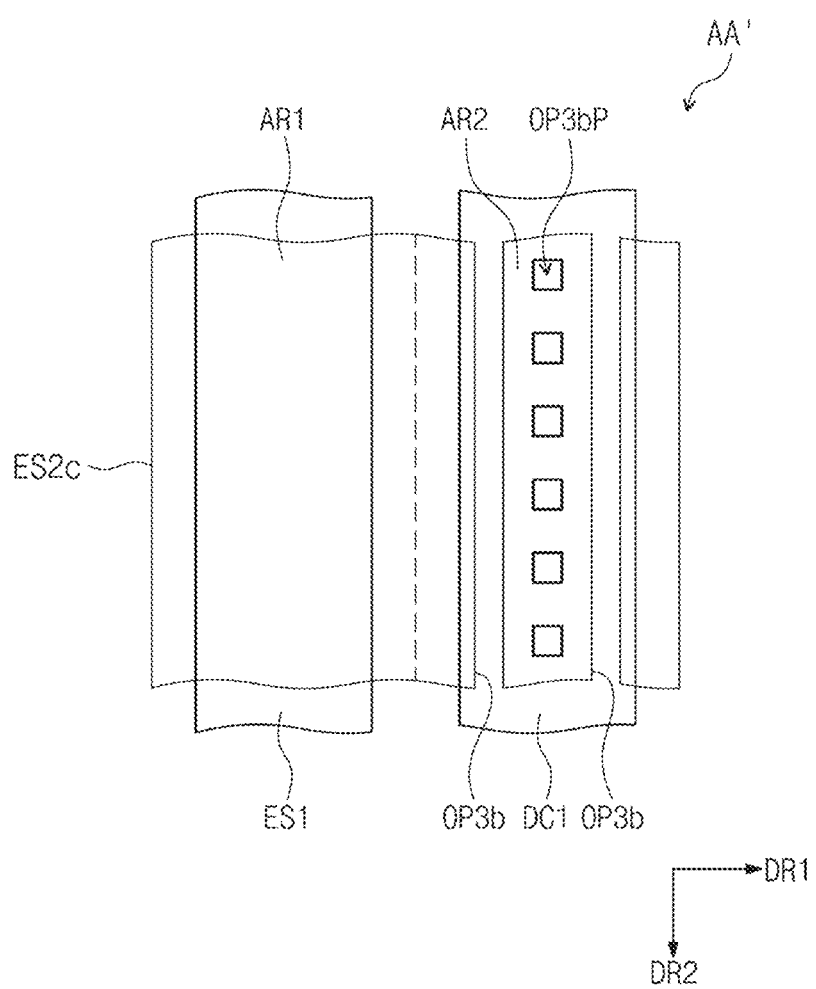
FIG. 18 is a plan view illustrating an example of the enlarged area AA' of FIG. 3.

FIG. 18 is a plan view illustrating an example of the enlarged area AA' of FIG. 3.

Referring to FIG. 18, a second power electrode ES2c includes a first area AR1 overlapping the first power electrode ES1 and a second area AR2 overlapping the first driving circuit DC1.

A plurality of third openings OP3b and third opening patterns OP3bp for exposing the first planarization layer 250 (refer to FIG. 16) is defined in the second area AR2 of the second power electrode ES2c. The third openings OP3b and the third opening patterns OP3bp may discharge a gas generated in the first planarization layer 250. The third openings OP3b may extend in the second direction DR2 and be disposed to be spaced apart from each other in the first direction DR1. The third opening patterns OP3bp may be disposed between the third openings OP3b and arranged in the second direction DR2.

Figure 19:
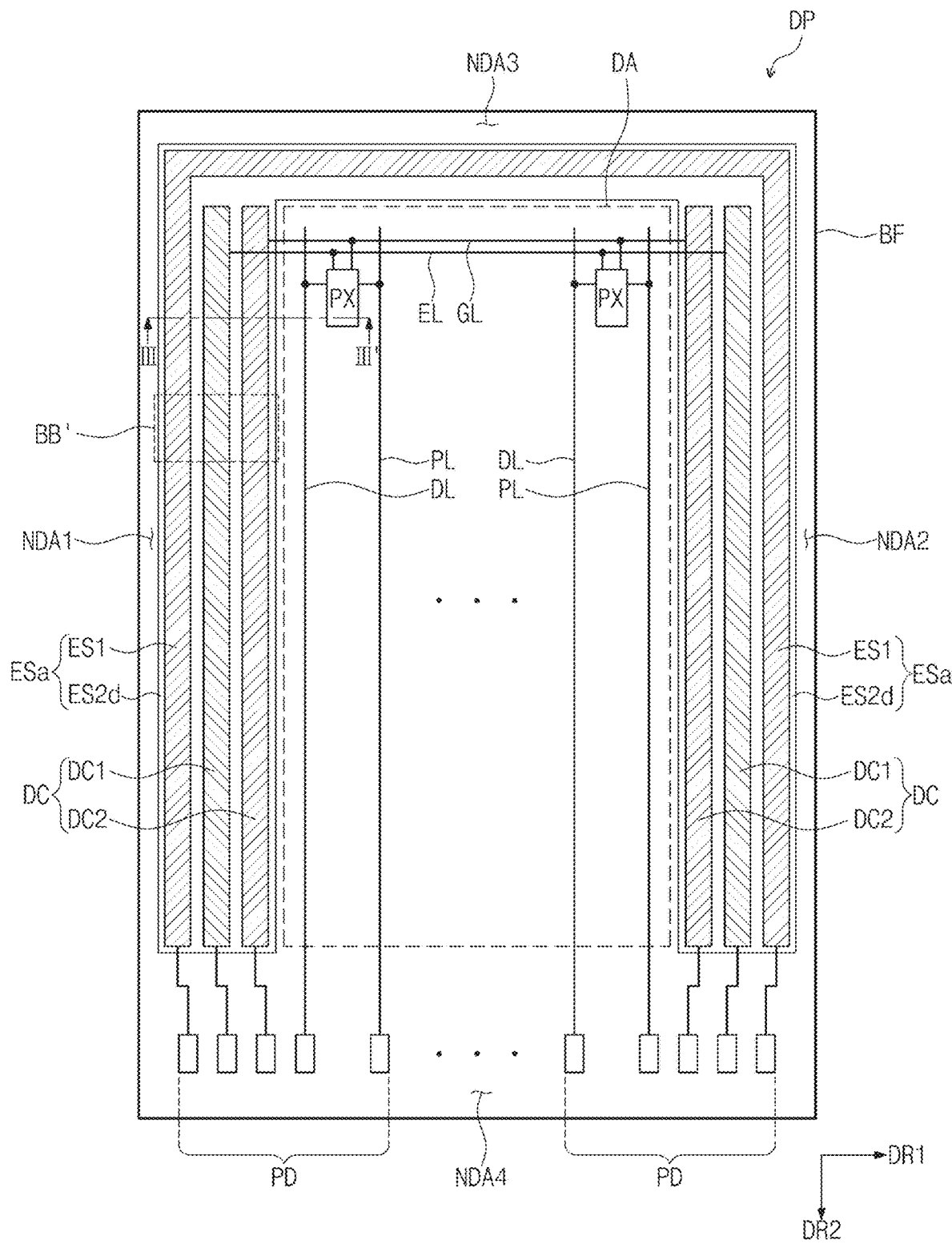
FIG. 19 is a plan view illustrating an exemplary embodiment of a portion of the display panel according to the invention.
Figure 20:
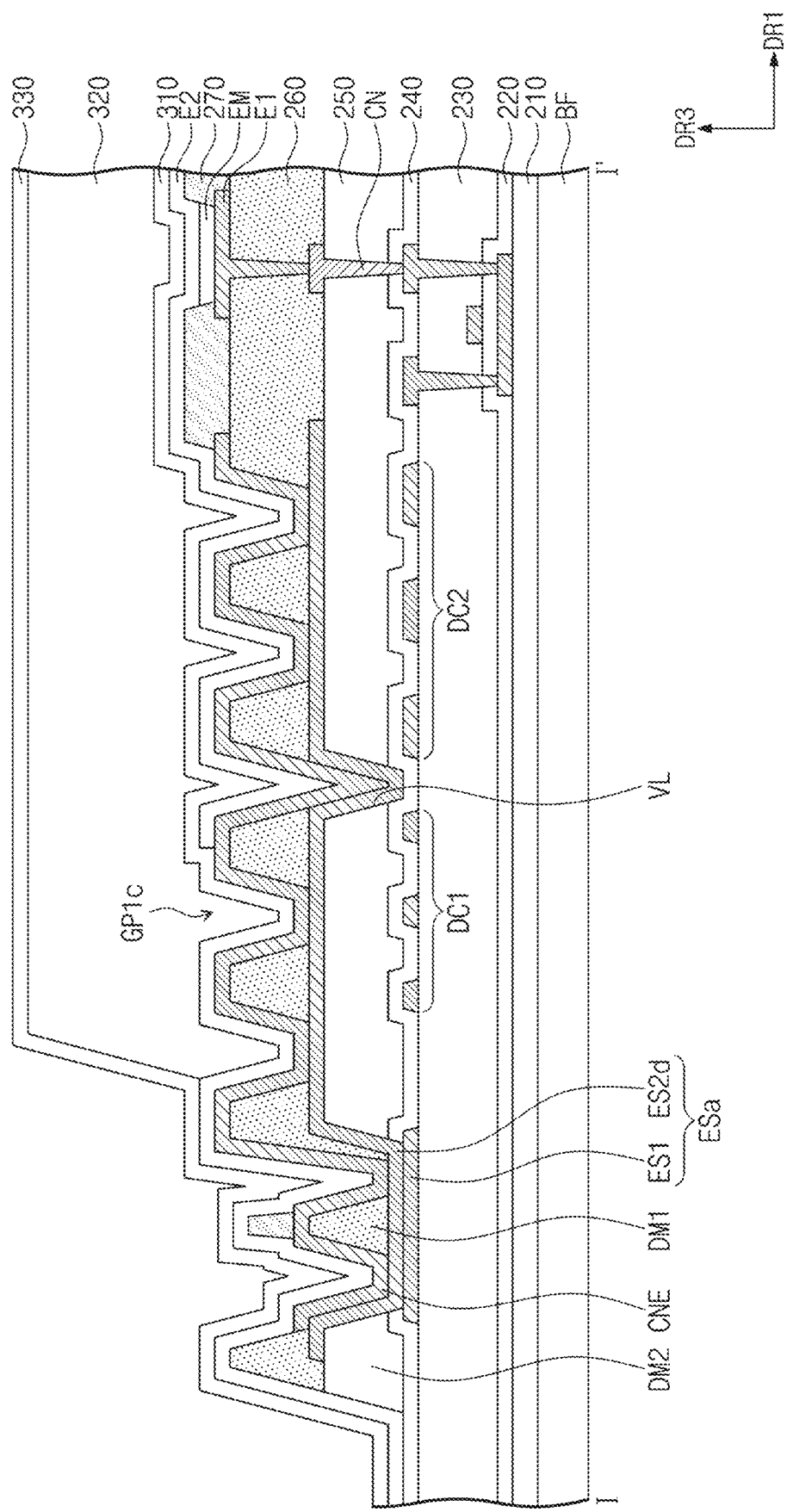
FIG. 20 is a cross-sectional view taken along line of FIG. 19.

FIG. 19 is a plan view illustrating a portion of the display panel according to an exemplary embodiment of the invention, and FIG. 20 is a cross-sectional view taken along line of FIG. 19. In description of FIGS. 19 and 20, the same reference numeral may be given to components that are the same as the components of FIGS. 3 and 5, and their detailed descriptions will be omitted.

Referring to FIGS. 19 and 20, a power electrode ESa may include a first power electrode ES1 and a second power electrode ES2d. Particularly, the first power electrode ES1 may be disposed outside the driving circuits DC to surround a portion of the display area DA, and the second power electrode ES2d may be disposed on the first power electrode ES1 to surround a portion of the display area DA. A portion of the second power electrode ES2d may overlap the driving circuits DC in the plan view. That is, when compared with FIG. 3, the second power electrode ES2d may overlap all the first directing circuit DC1 and the second driving circuit DC2.

The second power electrode ES2d may be formed up to an upper area of the second driving circuit DC2 via a valley VL defined between the first driving circuit DC1 and the second driving circuit DC2 in the first planarization layer 250.

The valley area VL may be provided by removing portions of the first planarization layer 250 and the second planarization layer 260. The valley area VL may be disposed to surround the display area DA in the plan view. The valley area VL may prevent air and moisture from being permeated into the display area DA through the insulation layer (e.g., the first planarization layer 250 and the second planarization layer 260) including the organic material. However, in another exemplary embodiment of the invention, the valley area VL may be omitted.

A groove part GP1c may be defined in the second planarization layer 260, and the groove part GP1c may overlap the first planarization layer 250 and the second power electrode ES2d in the plan view. Also, one portion of the groove part GP1c may overlap the first driving circuit DC1, and another portion may overlap the second driving circuit DC2.

Figure 21:
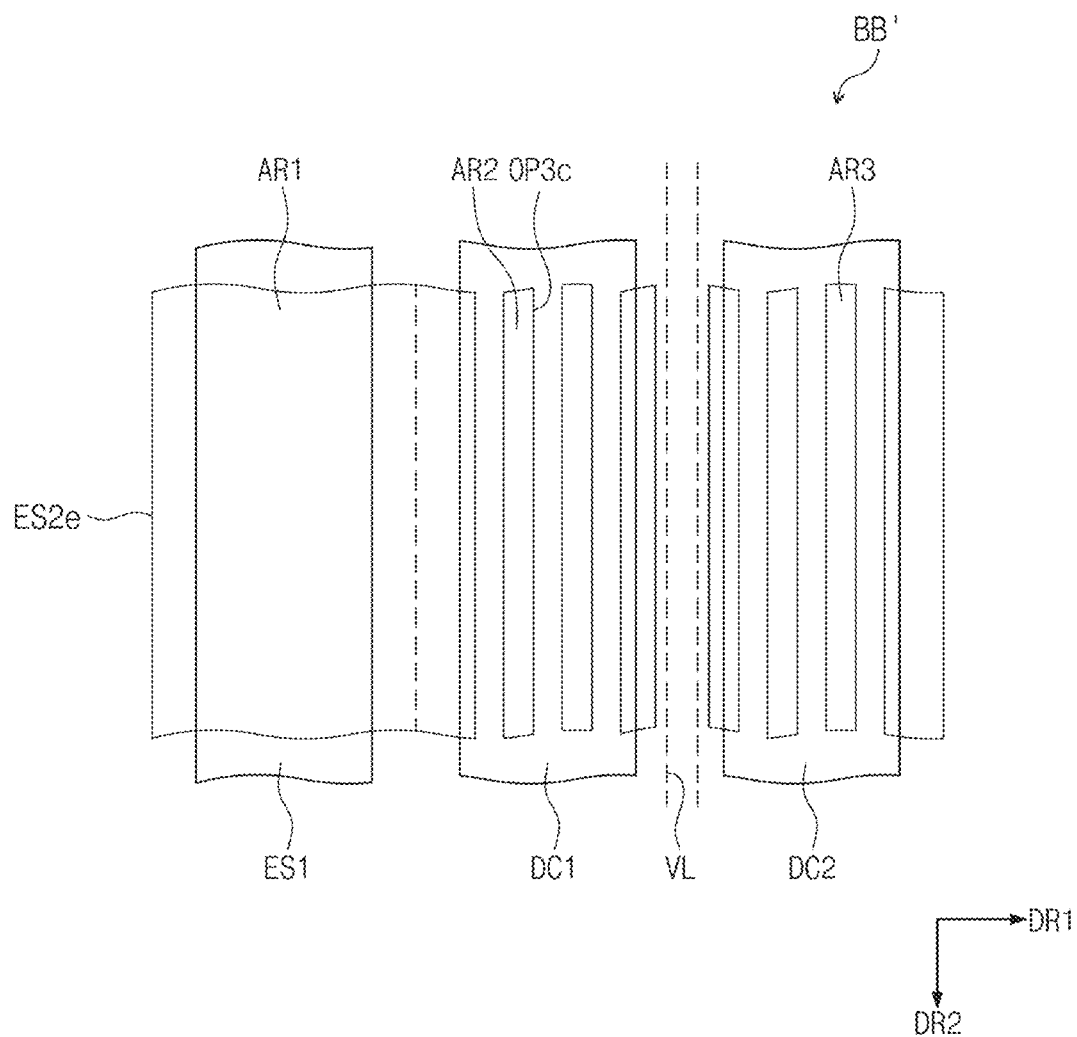
FIG. 21 is an enlarged plan view of an area BB' of FIG. 19.

FIG. 21 is an enlarged plan view of an area BB' of FIG. 19.

Referring to FIG. 21, a second power electrode ES2e includes a first area AR1 overlapping the first power electrode ES1, a second area AR2 overlapping the first driving circuit DC1, and a third area AR3 overlapping the second driving circuit DC2.

A plurality of third openings OP3c through the first planarization layer 250 (refer to FIG. 20) is exposed is defined in the third area AR3 of the second power electrode ES2e. The plurality of third openings OP3c may not overlap the valley area VL provided in the first planarization layer 250.

In FIG. 21, the third openings OP3c may extend in the second direction DR2 and be spaced apart from each other in the first direction DR1. However, the third openings OP3c may have shapes similar to those of FIGS. 14 and 18.

Figure 22:
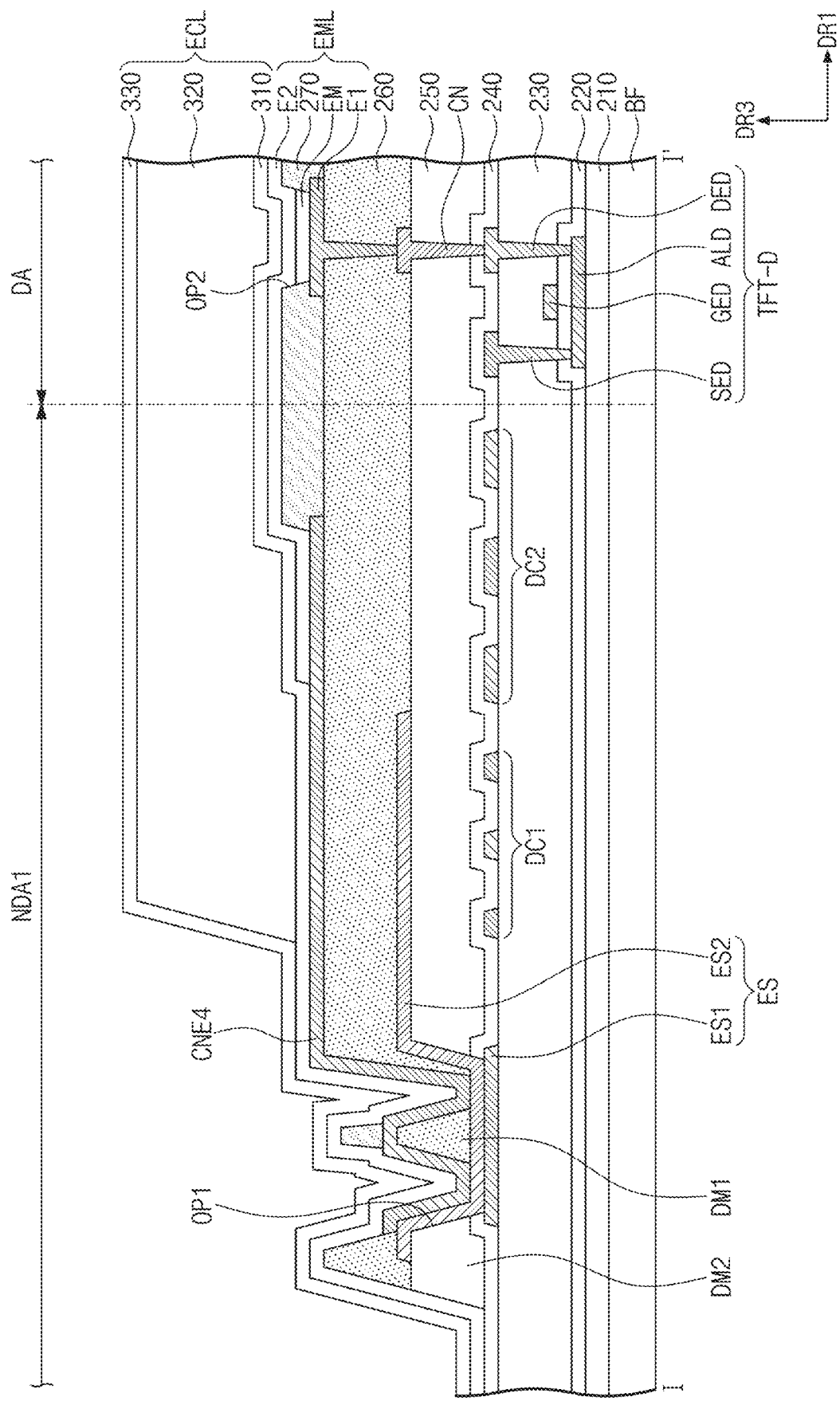
FIG. 22 is a cross-sectional view taken along line I-I' of FIG. 3.

FIG. 22 is a cross-sectional view taken along line I-I' of FIG. 3 according to an exemplary embodiment. In description of FIG. 22, the same reference numeral may be given to components that are the same as the components of FIG. 5, and their detailed descriptions will be omitted.

Referring to FIG. 22, when compared with FIG. 5, the groove part GP1 (refer to FIG. 5) may be omitted. Thus, a connection electrode CNE4 may extend up to the portion in which the first opening OP1 is defined to contact the power electrode ES. According to an exemplary embodiment of the invention, the second power electrode ES2 may be expanded to overlap the area on which the driving circuit DC (refer to FIG. 3) is disposed. Thus, the level of the second power voltage ELVSS (refer to FIG. 4) may be uniformly maintained within the power electrode ES.

The power electrode according to the exemplary embodiment of the invention may include the first power electrode and the second power electrode. The second power electrode may be disposed to overlap the area on which the driving circuits are disposed in the plan view. Thus, the total resistance of the power electrode may be reduced, and the level of the second power voltage provided to the power electrode may be uniformly maintained within the power electrode. Thus, the display device may display the image having the uniform image quality.

According to the exemplary embodiment, the groove part and the dams provided in the second planarization layer to prevent the liquid organic materials from overflowing. Thus, although the non-display area is reduced in width, the overflowing organic materials may be primarily controlled by the groove part. Therefore, the thin film encapsulation may be more improved in reliability.

It will be apparent to those skilled in the art that various modifications and variations may be made in the invention. Thus, it is intended that the invention covers the modifications and variations of this invention provided they come within the scope of the appended claims and their equivalents. Thus, to the maximum extent allowed by law, the scope of the invention is to be determined by the broadest permissible interpretation of the following claims and their equivalents, and shall not be restricted or limited by the foregoing detailed description.

What is claimed is:

1. A display device comprising:
a base layer;
a first power electrode disposed on the base layer;
a first layer in which a first opening through which at least a portion of the first power electrode is exposed;
a second power electrode contacting the first power electrode which is exposed through the first opening;
a second layer disposed on the first layer and covering at least a portion of the second power electrode; and
a light emitting element layer disposed on the second layer and comprising a first electrode disposed on the second layer, an emission layer disposed on the first electrode, and a second electrode disposed on the emission layer.

2. The display device of claim 1, further comprising an insulation layer disposed between the first power electrode and the first layer, wherein the second layer covers less than an entire portion of the second power electrode.

3. The display device of claim 2, wherein the insulation layer comprises an inorganic material.

4. The display device of claim 1, further comprising a driving transistor disposed on the base layer and comprising a semiconductor pattern, a control electrode, a first transistor electrode, and a second transistor electrode,
wherein the first power electrode includes a same material as that of the first transistor electrode and the second transistor electrode.

5. The display device of claim 1, further comprising a third electrode disposed on the first layer,
wherein the second power electrode includes a same material as that of the third electrode.

6. The display device of claim 1, further comprising a connection electrode electrically connected to the second electrode and the second power electrode.

7. The display device of claim 6, wherein the connection electrode and the first electrode include a same material.

8. The display device of claim 1, wherein the second power electrode is electrically connected to the second electrode of the light emitting element layer.

9. The display device of claim 1, wherein the first layer and the second layer comprise an organic material.

10. The display device of claim 1, further comprising a pixel defining layer disposed on the second layer and covers at least a portion of the first electrode,
wherein a portion of the first electrode is exposed through an opening defined in the pixel defining layer, and the emission layer disposed on the portion of the first electrode.

11. The display device of claim 1, further comprising a thin film encapsulation layer disposed on the second electrode and sealing the light emitting element layer.

12. The display device of claim 1, further comprising a driving circuit disposed on the base layer and covered by the first layer,
wherein the driving circuit comprises a first driving circuit and a second driving circuit, and the second driving circuit is disposed between the first driving circuit and a display area in which the emission layer is disposed, in a plan view, and the second power electrode overlaps the first driving circuit in the plan view.

13. The display device of claim 12, wherein the second power electrode overlaps the first driving circuit and the second driving circuit in the plan view.

14. A display device comprising:
a base layer;
a first power electrode disposed on the base layer;
a first layer comprising a first opening overlapping at least a portion of the first power electrode;
an insulation layer disposed between the first power electrode and the first layer;

a second power electrode contacting the portion of the first power electrode via the first opening;

a second layer disposed on the first layer and covering at least a portion of the second power electrode;

a light emitting element layer comprising a first electrode disposed on the second layer, an emission layer disposed on the first electrode, and a second electrode disposed on the emission layer, a pixel defining layer disposed on the second layer and covers at least a portion of the first electrode, and a thin film encapsulation layer disposed on the second electrode.

15. The display device of claim 14, wherein the insulation layer comprises an inorganic material.

16. The display device of claim 14, further comprising a driving transistor disposed on the base layer and comprising a semiconductor pattern, a control electrode, a first transistor electrode, and a second transistor electrode, wherein the first power electrode includes a same material as that of the first transistor electrode and the second transistor electrode.

17. The display device of claim 16, further comprising a third electrode disposed on the first layer, wherein the second power electrode includes a same material as that of the third electrode.

18. The display device of claim 14, further comprising a connection electrode electrically connected to the second electrode and the second power electrode.

19. The display device of claim 18, wherein the connection electrode and the first electrode include a same material.

20. The display device of claim 14, wherein the first layer and the second layer comprise an organic material.

* * * * *